(12) United States Patent
Rathinasamy et al.

(10) Patent No.: US 11,747,872 B1
(45) Date of Patent: Sep. 5, 2023

(54) TOOLLESS CARD/BRACKET COUPLING SYSTEM

(71) Applicant: Dell Products L.P., Round Rock, TX (US)

(72) Inventors: Shree Rathinasamy, Round Rock, TX (US); Maunish Shah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/681,965

(22) Filed: Feb. 28, 2022

(51) Int. Cl.
*G06F 1/18* (2006.01)
*H05K 5/02* (2006.01)

(52) U.S. Cl.
CPC ........... *G06F 1/183* (2013.01); *H05K 5/0265* (2013.01)

(58) Field of Classification Search
CPC ....................................................... G06F 1/168
See application file for complete search history.

(56) References Cited

U.S. PATENT DOCUMENTS

2006/0133059 A1* 6/2006 Dean ................... G06F 1/186
361/801

FOREIGN PATENT DOCUMENTS

CN            101035423 A  *  9/2007

\* cited by examiner

*Primary Examiner* — Jerry Wu
(74) *Attorney, Agent, or Firm* — Joseph Mencher

(57) ABSTRACT

A toolless card/bracket coupling system includes a card bracket base that mounts to a chassis with a chassis mounting configuration, spaced-apart card securing support members extending from the card bracket base, and a toolless card securing subsystem on each of the card securing support members. Each toolless card securing subsystem may move towards a respective card aperture defined by the card while in a securing orientation, engage its respective card aperture and, in response, transition to a coupling orientation that allows that toolless card securing subsystem to move through its respective card aperture and, in response to extending through its respective card aperture and through the card, transition back to the securing orientation to secure the card to the card bracket base via engagement with the card.

20 Claims, 26 Drawing Sheets

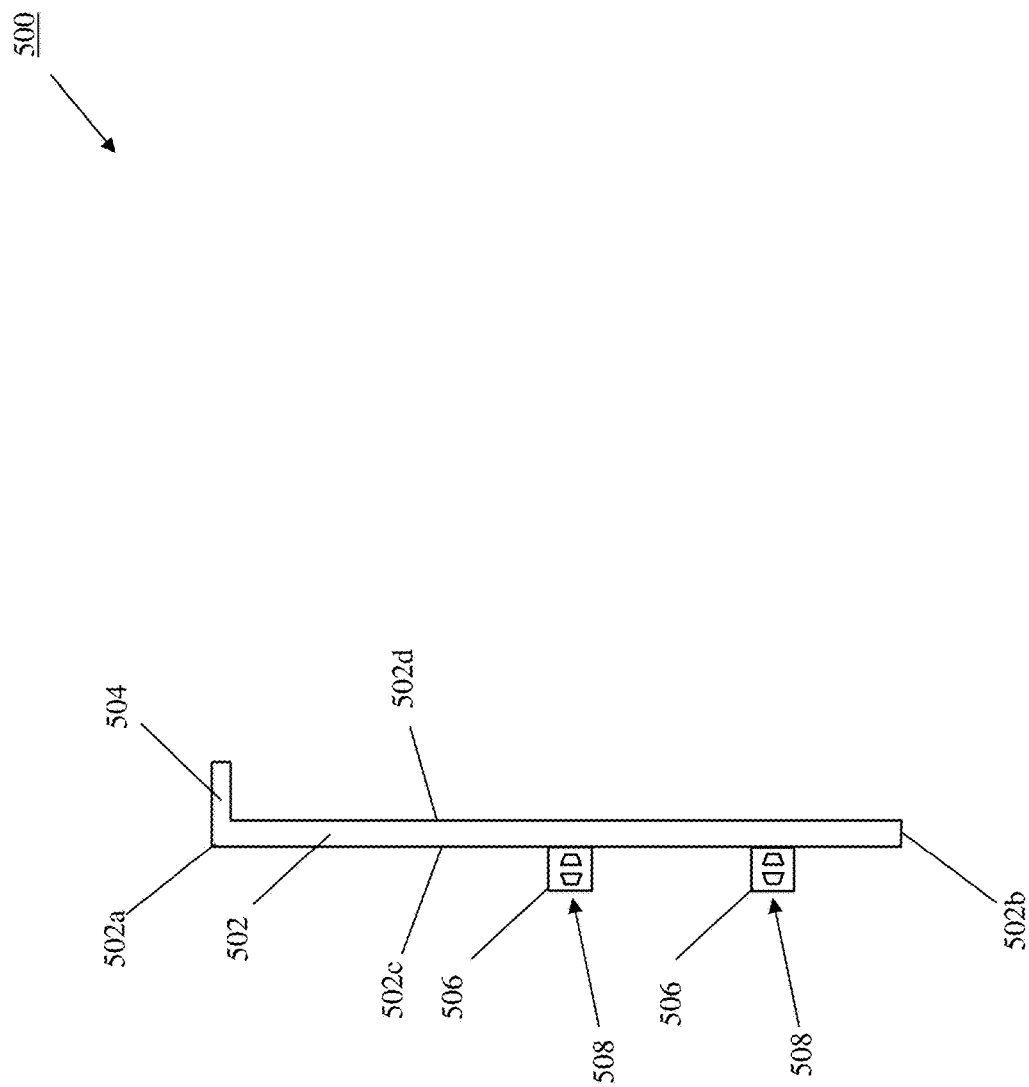

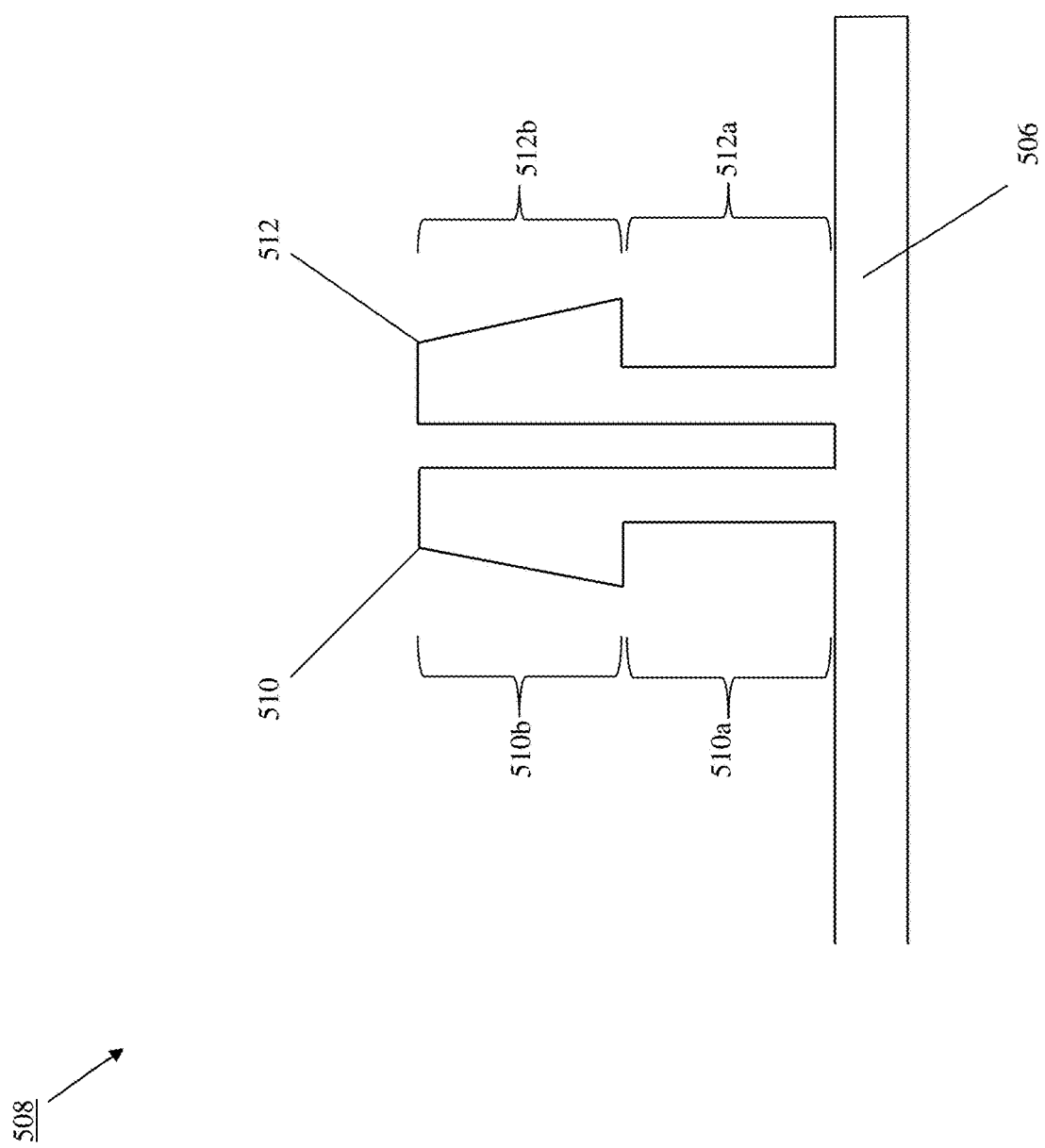

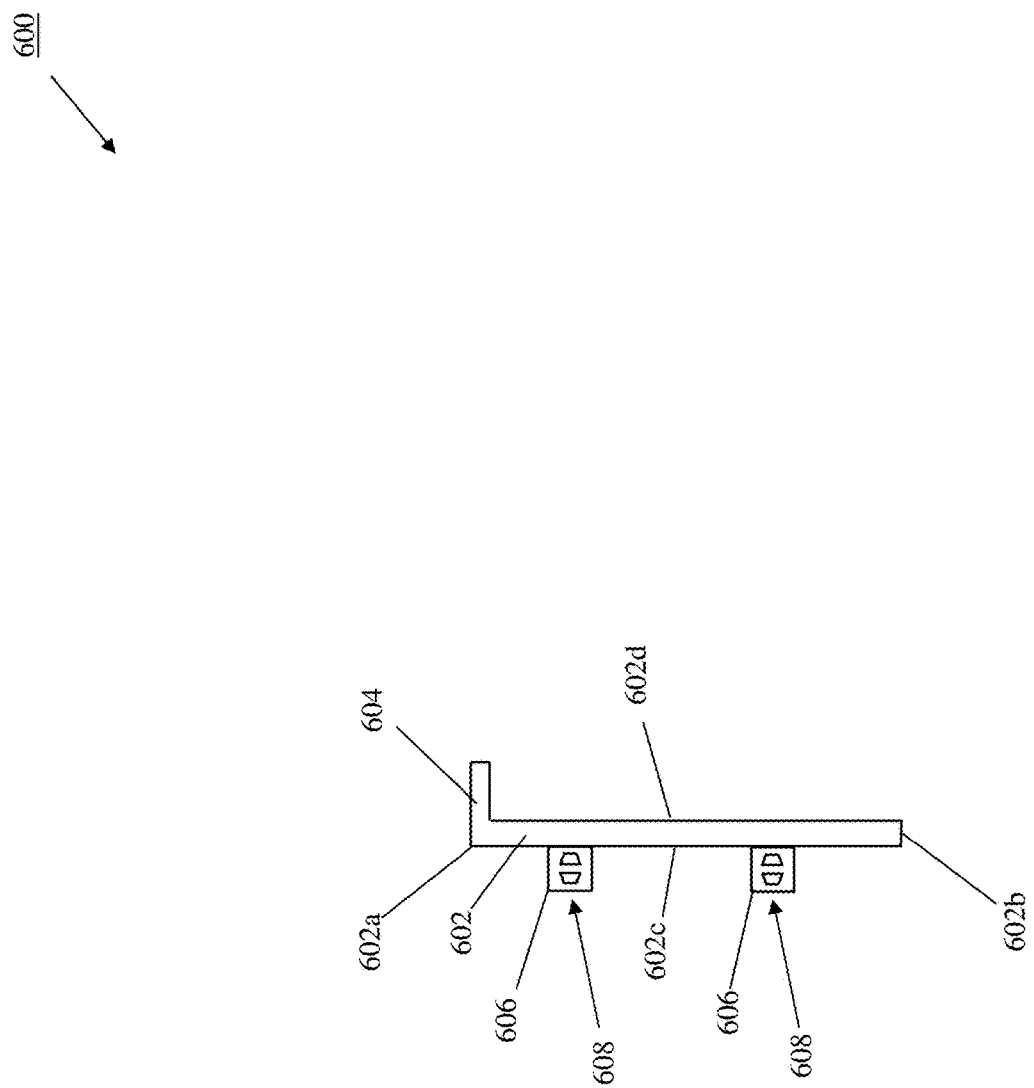

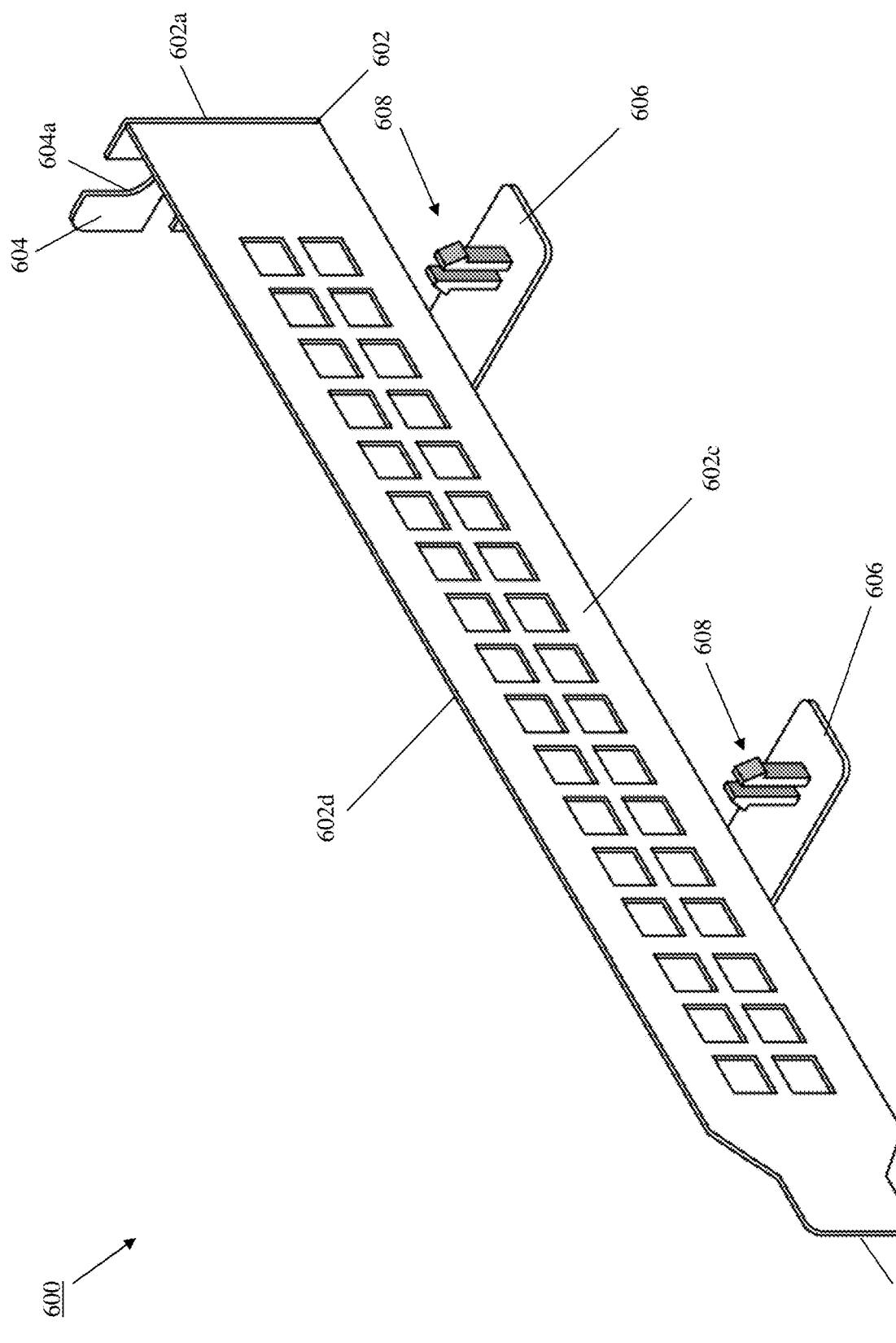

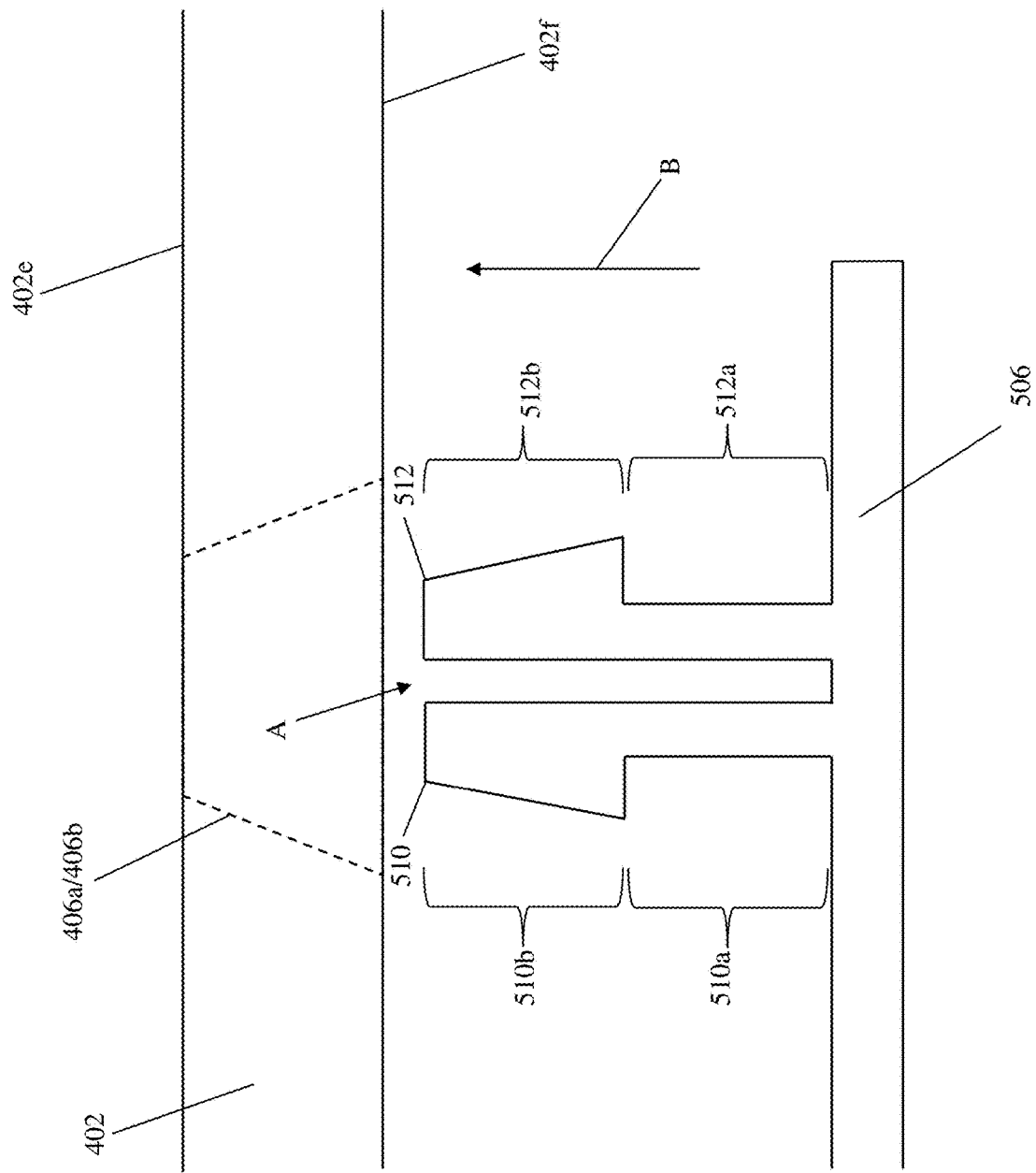

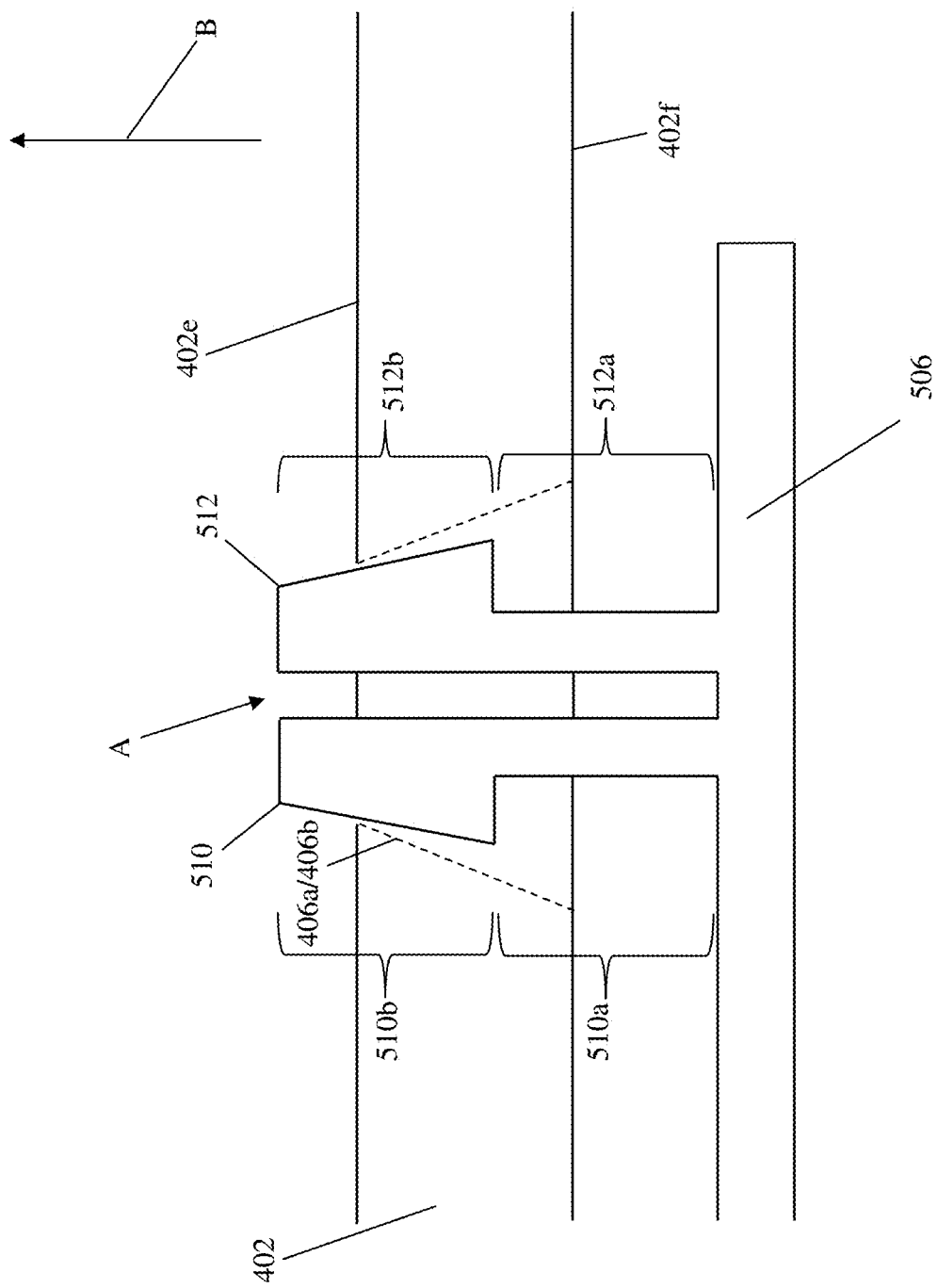

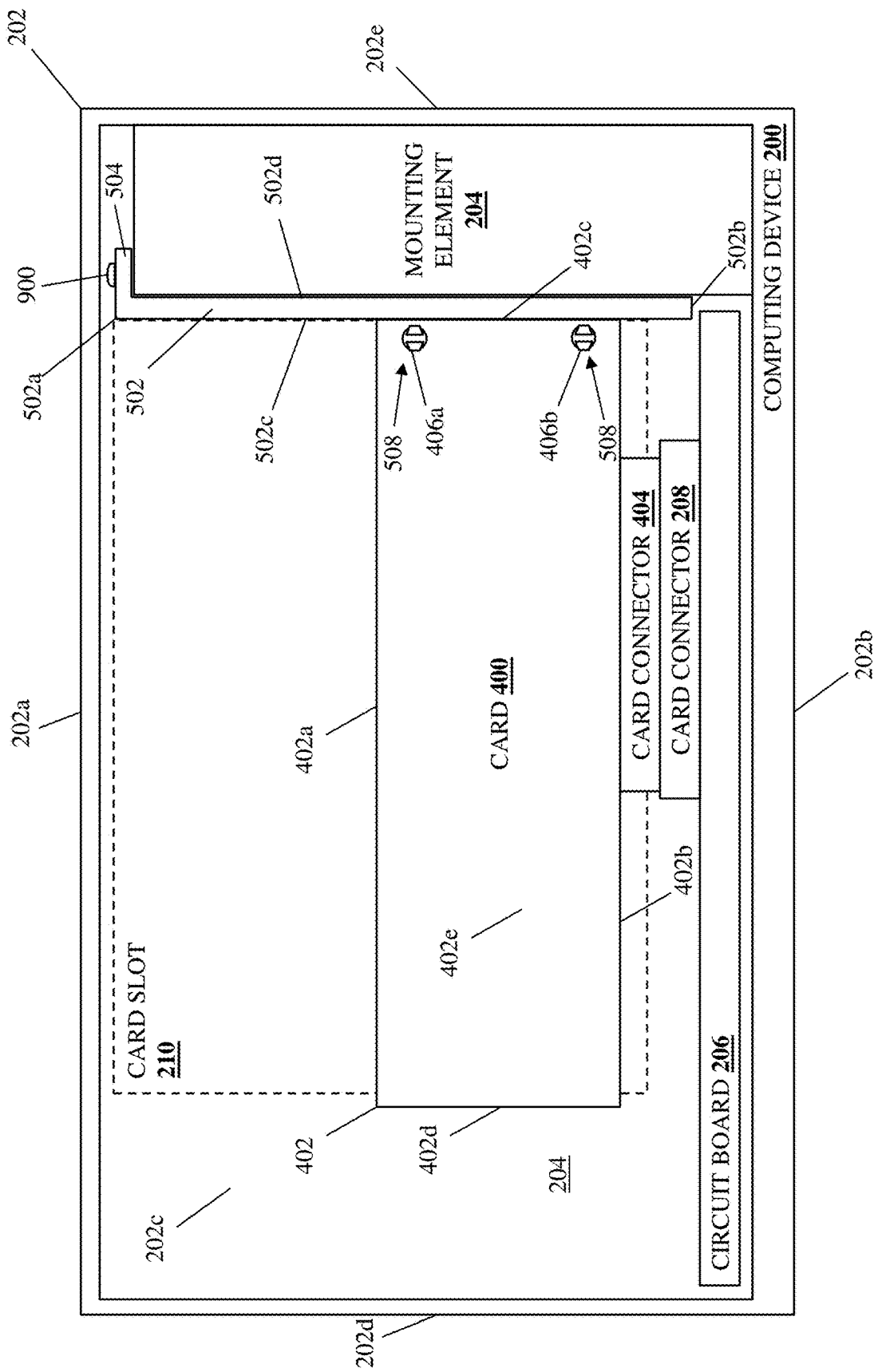

1200

```
┌─────────────────────────────┐
│ TOOLLESS CARD SECURING      │
│ SUBSYSTEMS ON CARD BRACKET  │
│ TRANSITION FROM SECURING    │
│ ORIENTATION TO COUPLING     │
│ ORIENTATION IN RESPONSE TO  │
│ FORCE PROVIDED WITHOUT USE  │
│ OF A TOOL                   │
│            1202             │
└─────────────────────────────┘
              │
              ▼
┌─────────────────────────────┐
│ TOOLLESS CARD SECURING      │
│ SUBSYSTEMS ON CARD BRACKET  │
│ MOVE FROM 2ND SIDE OF CARD  │
│ AND THROUGH RESPECTIVE CARD │
│ APERTURES ON CARD IN        │
│ COUPLING ORIENTATION TO     │
│ UNSECURE CARD FROM CARD     │
│ BRACKET                     │
│            1204             │
└─────────────────────────────┘
```

FIG. 12

TOOLLESS CARD/BRACKET COUPLING SYSTEM

BACKGROUND

The present disclosure relates generally to information handling systems, and more particularly to coupling brackets to a card without the use of tools so that the card may be mounted in and coupled to an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, sometimes utilize cards in order to expand their functionality. For example, Peripheral Component Interconnect express (PCIe) cards are often used to expand the functionality of server devices, with a bracket connected to a PCIe card, and then mounted to the chassis of the server device after the PCIe card has been positioned in a PCIe card slot in the server device and connected to a PCIe card connector on a motherboard in the server device. However, different server devices and/or different PCIe card slots may provide different mounting configurations for PCIe cards. For example, some PCIe card slots may be provided as "full-height" PCIe card slots or "half-height" PCIe card slots, with full-height PCIe card slots requiring a "full-height" bracket on a PCIe card in order to mount to the chassis of the server device, and with half-height PCIe card slots requiring a "half-height" bracket on a PCIe card in order to mount to the chassis of the server device. As such, PCIe cards and/or server devices are often provided with both full-height and half-height brackets in order to enable the use of PCIe cards in either full-height or half-height PCIe card slots.

However, the connection of brackets to PCIe cards can raise some issues. Conventional brackets include a pair of screw coupling elements that define respective screw holes that are configured to align with corresponding holes on the PCIe card, and a user may connect either of the full-height bracket or the half-height bracket discussed above to the PCIe card by aligning the holes on the PCIe card with the screw holes defined by the screw coupling elements on either of the full-height bracket or the half-height bracket, and then threading a respective screw into each of those screw holes. As such, the user is required to locate the correct type of screwdriver and screws, align the PCIe card and bracket, and thread each of the screws using the screwdriver, which is a time-consuming process. Furthermore, these issues can be exacerbated in situations in which a PCIe card is moved between a full-height PCIe card slot and a half-height PCIe card slot, as the user must locate the correct type of screwdriver, remove the screws from the existing bracket using the screwdriver, remove the existing bracket, locate the new bracket, align the PCIe card and the new bracket, and thread each of the screws using the screwdriver.

Accordingly, it would be desirable to provide card/bracket coupling system that addresses the issues discussed above.

SUMMARY

According to one embodiment, an Information Handling System (IHS) includes a chassis; a first card slot that is defined by the chassis and that includes a first card mounting configuration; a first card connector that is located adjacent the first card slot; a first card that is connected to the first card connector; a first card bracket base that is mounted to the chassis and provided in the first card mounting configuration; a plurality of first card securing support members that extend from the first card bracket base in a spaced-apart orientation; and a toolless card securing subsystem that is included on each of the plurality of first card securing support members, wherein each toolless card securing subsystem that is included on each of the plurality of first card securing support members extends from a first side of the first card and through a respective first card aperture defined by the first card, and engages a second side of the first card that is opposite the first card from the first side of the first card in a securing orientation that secures the first card to the first card bracket base, and wherein each toolless card securing subsystem that is included on each of the plurality of first card securing support members is configured to: transition, while the first card is secured to the first card bracket base and in response to a force that is provided without the use of a tool, from the securing orientation to a coupling orientation that allows that toolless card securing subsystem to move through its respective first card aperture defined by the first card; and move, while in the coupling orientation, from the second side of the first card and through its respective first card aperture defined by the first card in order to unsecure the first card from the first card bracket base.

BRIEF DESCRIPTION OF THE DRAWINGS

FIG. 5A is a schematic view illustrating an embodiment of a full-height bracket providing the toolless card/bracket coupling system of the present disclosure.

FIG. 5C is a schematic view illustrating an embodiment of a toolless card securing subsystem included on the full-height bracket of FIGS. 5A and 5B.

FIG. 6A is a schematic view illustrating an embodiment of a half-height bracket providing the toolless card/bracket coupling system of the present disclosure.

FIG. 6B is a perspective view illustrating an embodiment of the half-height bracket of FIG. 5A.

FIG. 8B is a side view illustrating an embodiment of the card of FIG. 4 being coupled to the full-height bracket of FIGS. 5A-5C during the method of FIG. 7.

FIG. 8C is a side view illustrating an embodiment of the card of FIG. 4 being coupled to the full-height bracket of FIGS. 5A-5C during the method of FIG. 7.

FIG. 9 is a schematic view illustrating an embodiment of the card and bracket of FIG. 8F positioned in the full-height card slot and coupled and mounted to the computing device of FIG. 2.

FIG. 12 is a flow chart illustrating an embodiment of a method for toollessly uncoupling a card from a bracket.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
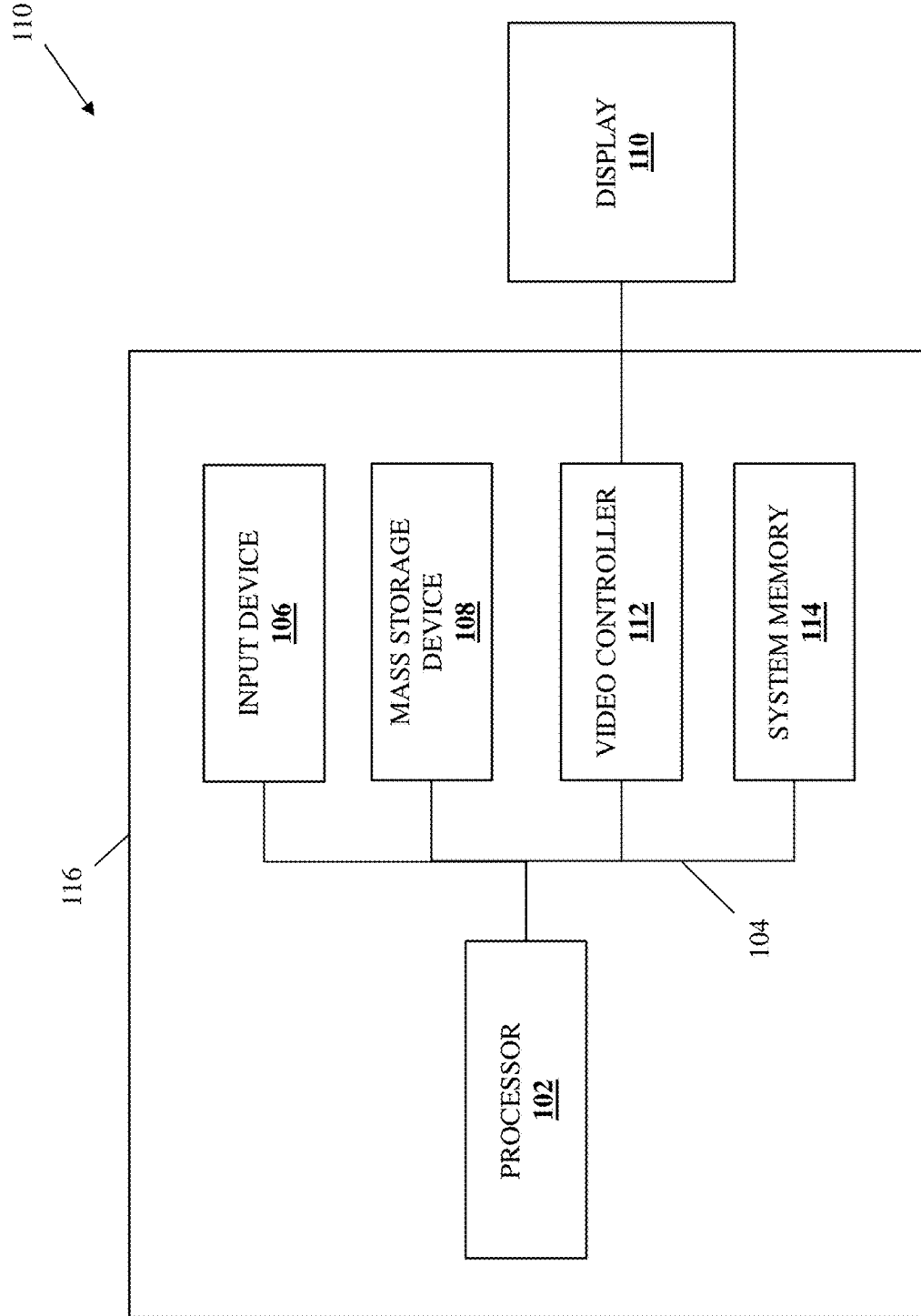
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
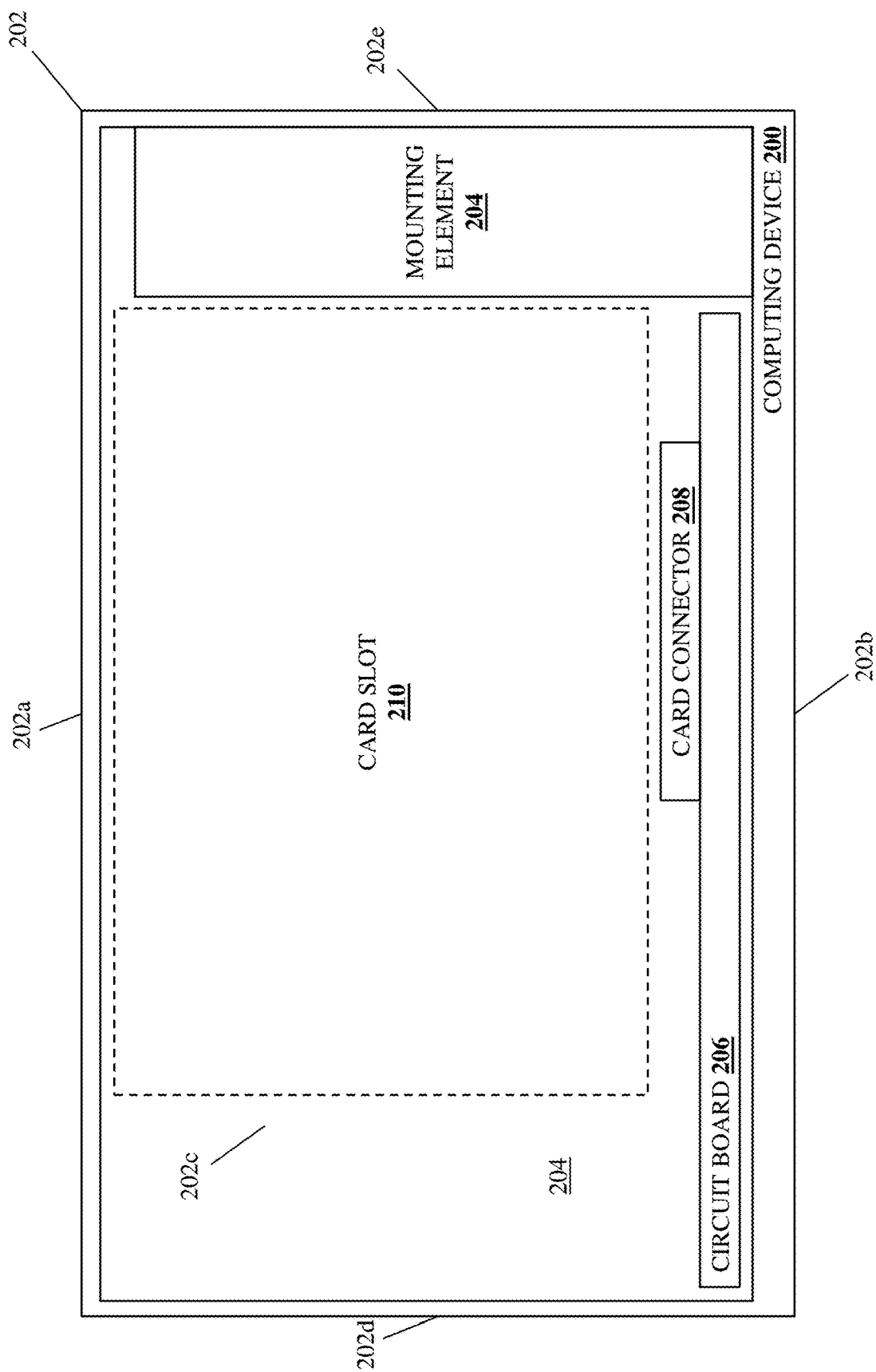
FIG. 2 is a schematic view illustrating an embodiment of a computing device including a full-height card slot.

Referring now to FIG. 2, an embodiment of a computing device 200 is illustrated that provides a "full-height" card slot/chassis mounting configuration. In the illustrated embodiment, the computing device 200 includes a chassis 202 that includes a top wall 202a, a bottom wall 202b that is located opposite the chassis 202 from the top wall 202a, rear wall 202c that extends between the top wall 202a and the bottom wall 202b, a front wall (which is not visible in FIG. 2 to enable a view of the components in the chassis 202) that is located opposite the chassis 202 from the rear wall 202c and that extends between the top wall 202a and the bottom wall 202b, and a pair of side walls 202d and 202e that are located opposite the chassis 202 from each other and that extend between the top wall 202a, the bottom wall 202b, the rear wall 202c, and the front wall. A chassis housing 204 is defined by the chassis 202 between the top wall 202a, the bottom wall 202b, the rear wall 202c, the front wall, and the side walls 202d and 202e.

In the illustrated embodiment, a mounting element 204 is located immediately adjacent the side wall 202e of the chassis 202, although one of skill in the art in possession of the present disclosure will appreciate that cards may be mounted in a variety of locations in a chassis of a computing device while remaining within the scope of the present disclosure as well. A circuit board 206 is included in the chassis housing 204 and may be provided by a motherboard and/or other circuit boards that would be apparent to one of skill in the art in possession of the present disclosure. A card connector 208 is included on the circuit board 206 and may be provided by a Peripheral Component Interconnect express (PCIe) card connector, as well as any other card connector that would be apparent to one of skill in the art in possession of the present disclosure. As illustrated, the configuration of the computing device 200 provides a "full-height" card slot 210, particularly when considered relative to the computing device 300 discussed below with reference to FIG. 3. However, while a specific computing device 200 has been illustrated and described, one of skill in the art in possession of the present disclosure will recognize that the toolless card/bracket coupling system of the present disclosure may be utilized in computing devices having a variety of components and component configurations while remaining within the scope of the present disclosure as well.

Figure 3:
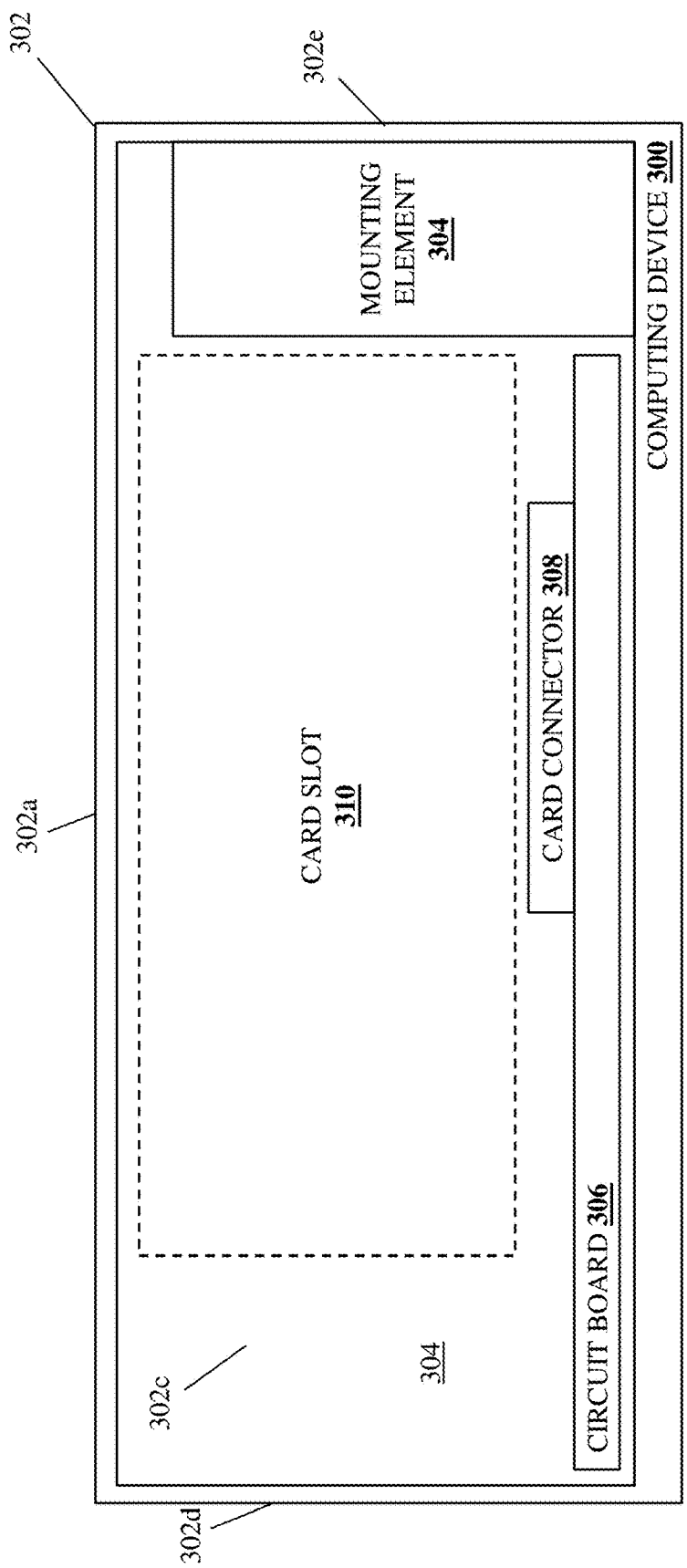
FIG. 3 is a schematic view illustrating an embodiment of a computing device including a half-height card slot.

Referring now to FIG. 3, an embodiment of a computing device 300 is illustrated that provides a "half-height" card slot/chassis mounting configuration. In the illustrated embodiment, the computing device 300 includes a chassis 302 that includes a top wall 302a, a bottom wall 302b that is located opposite the chassis 302 from the top wall 302a, rear wall 302c that extends between the top wall 302a and the bottom wall 302b, a front wall (which is not visible in FIG. 3 to enable a view of the components in the chassis 302) that is located opposite the chassis 302 from the rear wall 302c and that extends between the top wall 302a and the bottom wall 302b, and a pair of side walls 302d and 302e that are located opposite the chassis 302 from each other and that extend between the top wall 302a, the bottom wall 302b, the rear wall 302c, and the front wall. A chassis housing 304 is defined by the chassis 302 between the top wall 302a, the bottom wall 302b, the rear wall 302c, the front wall, and the side walls 302d and 302e.

In the illustrated embodiment, a mounting element 304 is located immediately adjacent the side wall 302e of the chassis 302, although one of skill in the art in possession of the present disclosure will appreciate that cards may be mounted in a variety of locations in a chassis of a computing device while remaining within the scope of the present disclosure as well. A circuit board 306 is included in the chassis housing 304 and may be provided by a motherboard and/or other circuit boards that would be apparent to one of skill in the art in possession of the present disclosure. A card connector 308 is included on the circuit board 306 and may be provided by a PCIe card connector, as well as any other card connector that would be apparent to one of skill in the art in possession of the present disclosure. As illustrated, the configuration of the computing device 300 provides a "half-height" card slot 310, particularly when considered relative to the computing device 200 discussed below with reference to FIG. 2. However, while a specific computing device 200 has been illustrated and described, one of skill in the art in possession of the present disclosure will recognize that the toolless card/bracket coupling system of the present disclosure may be utilized in computing devices having a variety of components and component configurations while remaining within the scope of the present disclosure as well.

Furthermore, while the computing devices 200 and 300 in FIGS. 2 and 3, respectively, are illustrated and described as separate computing devices, one of skill in the art in possession of the present disclosure will appreciate that the same computing device may provide both a "full-height" card slot and a "half-height" card slot like those illustrated in the computing devices 200 and 300 in FIGS. 2 and 3 while remaining within the scope of the present disclosure as well. As such, the discussion of mounting a card to a "full-height" card slot and then moving that card to a "half-height" card slot below may include moving that card between computing devices, or moving that card within a computing device.

Figure 4:
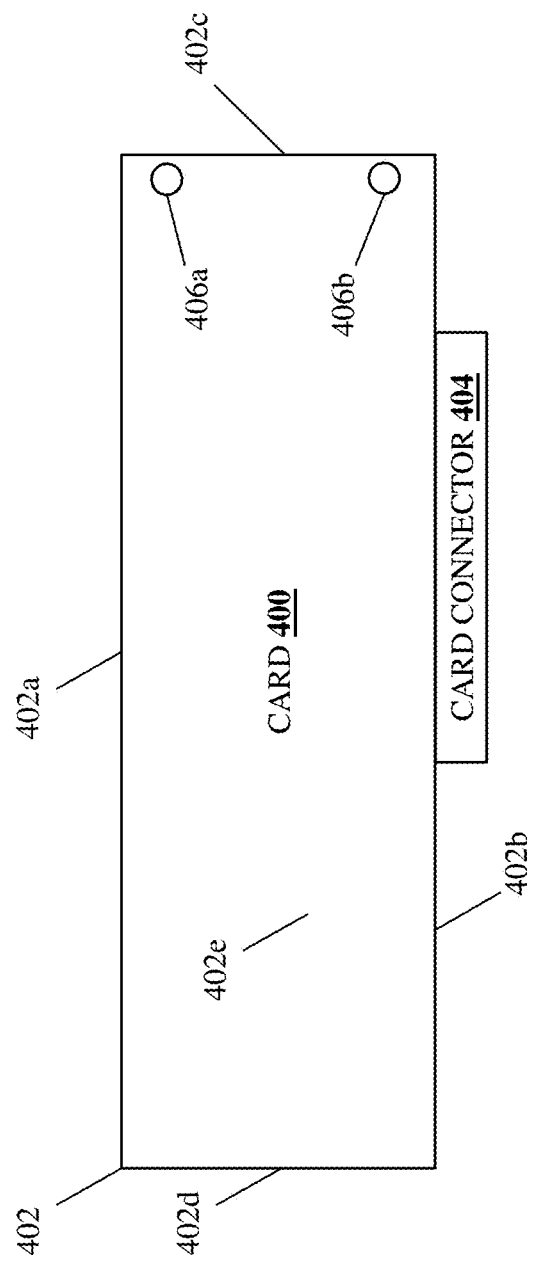
FIG. 4 is a schematic view illustrating an embodiment of a card.

Referring now to FIG. 4, an embodiment of a card 400 is illustrated. In an embodiment, the card 400 may be a PCIe card, as well as any other card that would be apparent to one of skill in the art in possession of the present disclosure. In the illustrated embodiment, the card 400 includes a base 402 having a top edge 402a, a bottom edge 402b that is located opposite the base 402 from the top edge 402a, a front edge 402c that extends between the top edge 402a and the bottom edge 402b, a rear edge 402d that is located opposite the base 402 from the front edge 402a and that extends between the top edge 402a and the bottom edge 402b, and a pair of side surface 402e and 402f (side surface 402f is not visible in FIG. 4, but is visible in FIGS. 8A-8E discussed in further detail below) that are located opposite the base 402 from each other and that extend between the top edge 402a, the bottom edge 402b, the front edge 402c, and the rear edge 402d. As illustrated, a card connector 404 extends from the bottom edge 402b of the base 402, and may be provided by a PCIe card connector, as well as any other card connector that would be apparent to one of skill in the art in possession of the present disclosure. Furthermore, the base 402 defines a plurality of card apertures 406a and 406b that extend through the base 402 between the side surfaces 402e and 402f, and that are located in a spaced apart orientation adjacent the front surface 402c (with the card aperture 406a located adjacent the top edge 402a as well, and the card aperture 406b located adjacent the bottom edge 402b as well). However, while a specific card 400 has been illustrated and described, one of skill in the art in possession of the present disclosure will recognize that the cards utilizing the teachings of the present disclosure may have a variety of components and component configurations while remaining within the scope of the present disclosure as well.

Figure 5B:
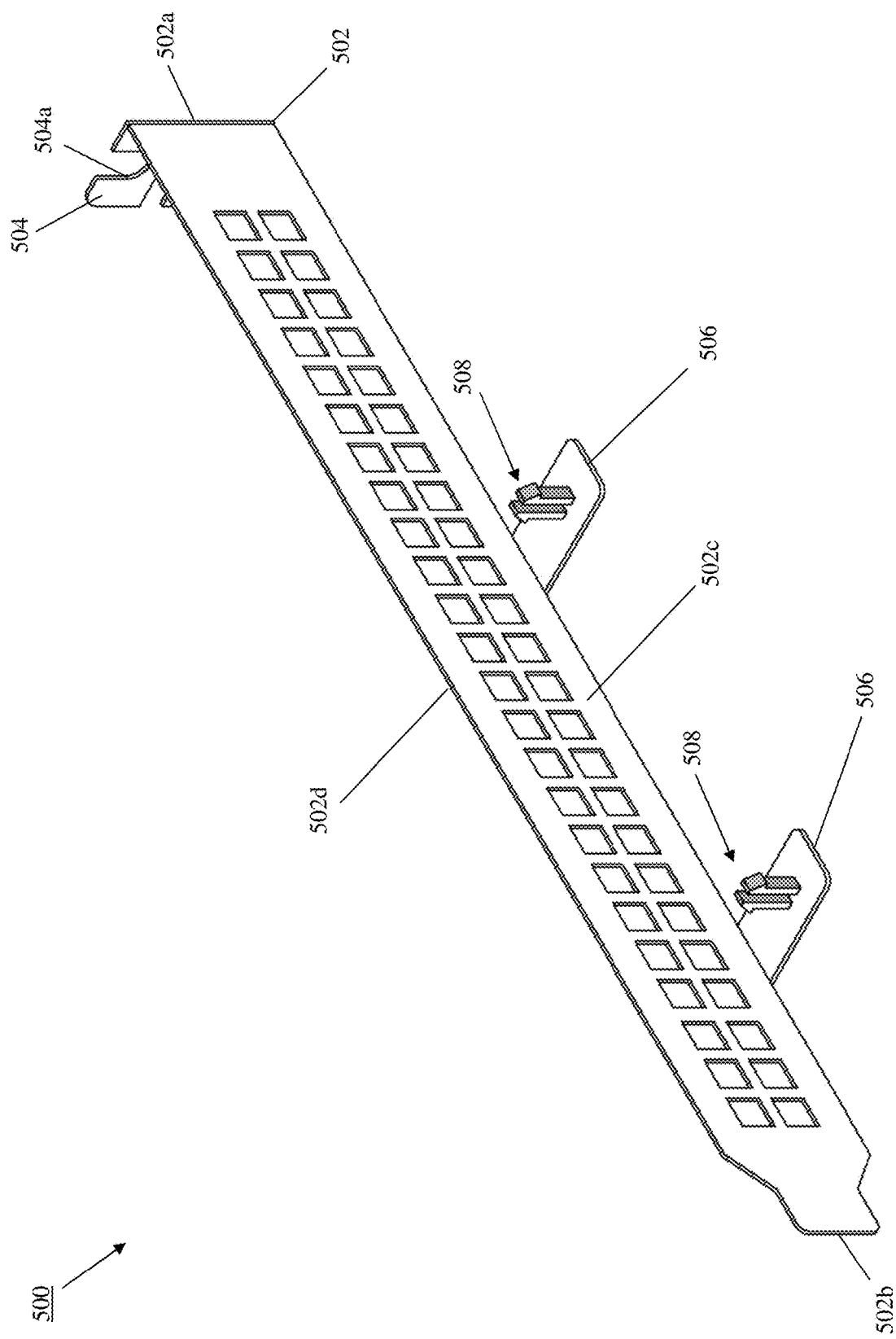
FIG. 5B is a perspective view illustrating an embodiment of the full-height bracket of FIG. 5A.

With reference to FIGS. 5A, 5B, and 5C, an embodiment of a "full-height" card bracket 500 is illustrated. In the illustrated embodiment, the "full-height" card bracket 500 includes a card bracket base 502 having a top edge 502a, a bottom edge 502b that is located opposite the card bracket base 502 from the top edge 502a, a front surface 502c that extends between the top edge 502a and the bottom edge 502b, and a rear surface 502d that is located opposite the card bracket base 502 from the front surface 502c and that extends between the top edge 502a and the bottom edge 502b. A chassis mounting member 504 extends from the top edge 502a of the card bracket base 502 and away from the rear surface 502d of the card bracket base 502, and defines a chassis mounting channel 504a. A pair of card securing support members 506 extend from the front surface 502c of the card bracket base 502 in a spaced-apart orientation from each other that corresponds to the spacing of the card apertures 406a and 406b defined by the card 400 discussed above with reference to FIG. 4. A toolless card securing subsystem 508 is provided on each of the card securing support members 506. In the illustrated embodiment, and as most clearly seen in FIG. 5C, each of the toolless card securing subsystems 508 includes a pair of toolless card securing members 510 and 512 that each extend from the card coupling support member 506 in a spaced-apart orientation, that each include a first portion 510a and 512a, respectively, having a first width, and that each include a second portion 510b and 512b, respectively, that is located opposite the first portion 510a and 512a, respectively, from the card coupling support member 512 and that has a second width that is greater than the first width of the first portion 510a and 512a, respectively. However, while a specific "full-height" card bracket 500, and particularly specific toolless card securing members, has been illustrated and described, one of skill in the art in possession of the present disclosure will recognize that the "full-height" card brackets and toolless card securing members provided according to the teachings of the present disclosure may have a variety of components and component configurations while remaining within the scope of the present disclosure as well.

Figure 6C:
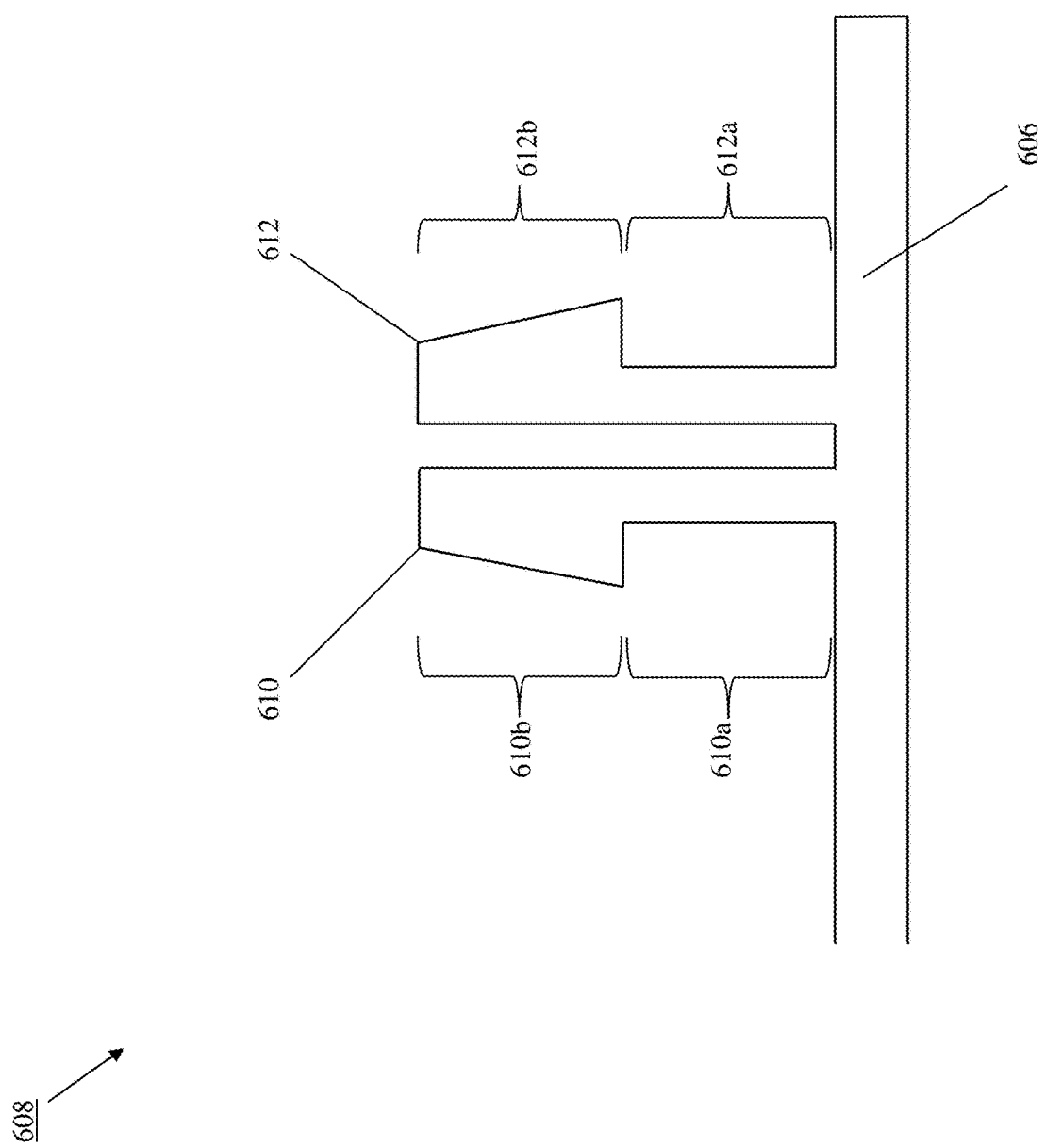
FIG. 6C is a schematic view illustrating an embodiment of a toolless card securing subsystem included on the half-height bracket of FIGS. 6A and 6B.

With reference to FIGS. 6A, 6B, and 6C, an embodiment of a "half-height" card bracket 600 is illustrated. In the illustrated embodiment, the "half-height" card bracket 600 includes a card bracket base 602 having a top edge 602a, a bottom edge 602b that is located opposite the card bracket base 602 from the top edge 602a, a front surface 602c that extends between the top edge 602a and the bottom edge 602b, and a rear surface 602d that is located opposite the card bracket base 602 from the front surface 602c and that extends between the top edge 602a and the bottom edge 602b. A chassis mounting member 604 extends from the top edge 602a of the card bracket base 602 and away from the rear surface 602d of the card bracket base 602, and defines a chassis mounting channel 604a. A pair of card securing support members 606 extend from the front surface 602c of the card bracket base 602 in a spaced-apart orientation from each other that corresponds to the spacing of the card apertures 406a and 406b defined by the card 400 discussed above with reference to FIG. 4. A toolless card securing subsystem 608 is provided on each of the card securing support members 606. In the illustrated embodiment, and as most clearly seen in FIG. 6C, each of the toolless card securing subsystems 608 includes a pair of toolless card securing members 610 and 612 that each extend from the card coupling support member 606 in a spaced-apart orientation, that each include a first portion 610a and 612a, respectively, having a first width, and that each include a second portion 610b and 612b, respectively, that is located opposite the first portion 610a and 612a, respectively, from the card coupling support member 612 and that has a second width that is greater than the first width of the first portion 610a and 612a, respectively. However, while a specific "half-height" card bracket 600, and particularly specific toolless card securing members, has been illustrated and described, one of skill in the art in possession of the present disclosure will recognize that the "half-height" card brackets and toolless card securing members provided according to the teachings of the present disclosure may have a variety of components and component configurations while remaining within the scope of the present disclosure as well.

As will be appreciated by one of skill in the art in possession of the present disclosure and as discussed in further detail below, each of the "full-height" card bracket 500 and the "half-height" card bracket 600 are configured to couple to the card 400. In particular and as discussed above, the card securing support members 506 and 606 on the "full-height" card bracket 500 and the "half-height" card bracket 600, respectively, each include the same spacing that corresponds to the spacing of the card apertures 406a and 406b defined by the card 400 discussed above with reference to FIG. 4, with the toolless card securing subsystems 508 and 608 on the "full-height" card bracket 500 and the "half-height" card bracket 600, respectively, being substantially identical in order to enable the coupling of the card 400 to either of the "full-height" card bracket 500 and the "half-height" card bracket 600. As such, cards and/or computing devices may be provided by their manufacturers with both the "full-height" card bracket 500 and the "half-height" card bracket 600 in order to ensure that cards may be mounted in the chassis of the computing devices in either "full-height" cards slots or "half-height" card slots.

Figure 7:
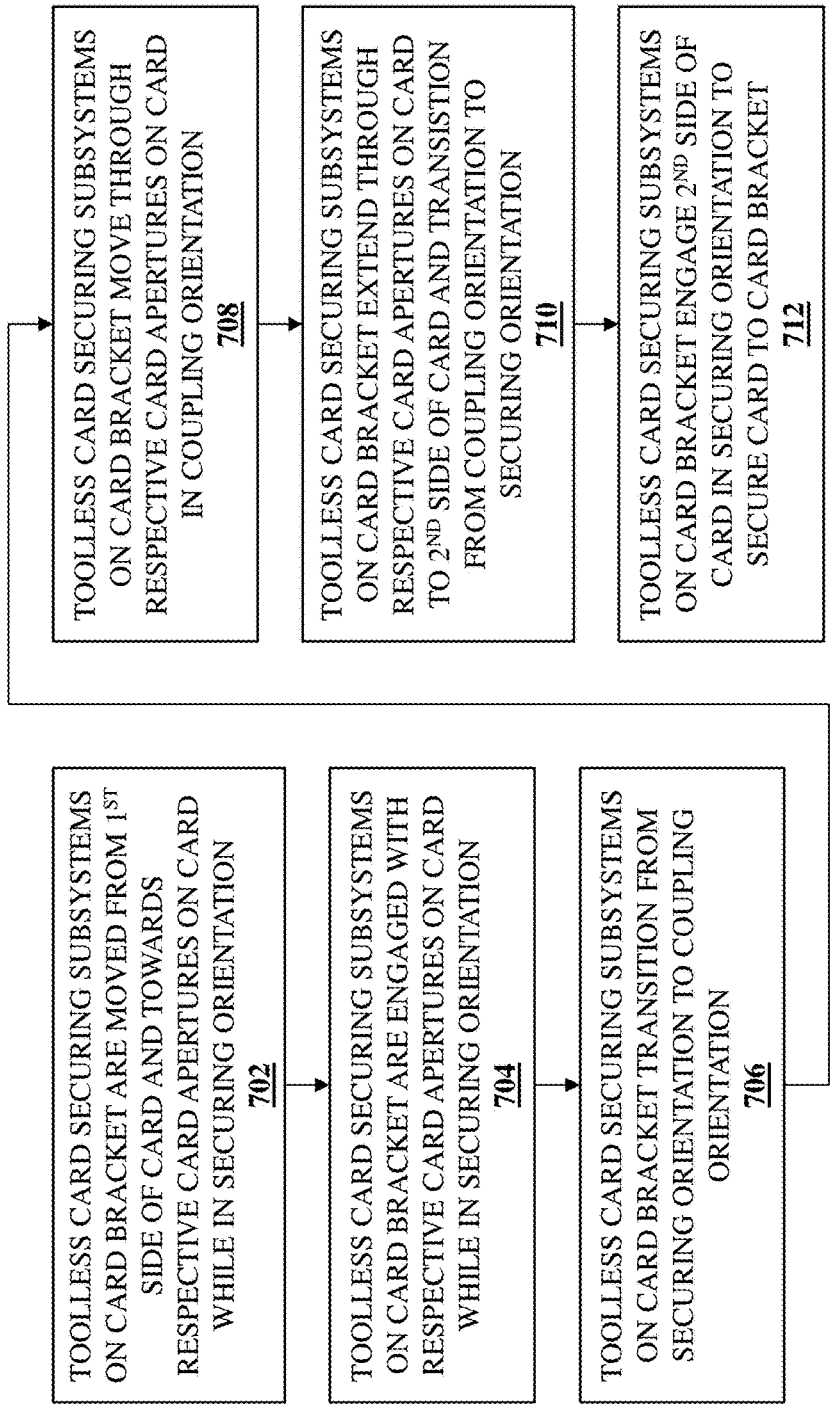
FIG. 7 is a flow chart illustrating an embodiment of a method for toollessly coupling a card to a bracket.

Referring now to FIG. 7, an embodiment of a method 700 for toollessly coupling a card to a bracket is illustrated. As discussed below, the systems and methods of the present disclosure provide for the coupling of brackets to a card without the use of a tool, allowing the bracket used to mount a card in a chassis to be quickly and easily switched when the card is moved between different chassis locations with different chassis mounting configurations. For example, the toolless card/bracket coupling system of the present disclosure may include a card bracket base that mounts to a chassis with a chassis mounting configuration, spaced-apart card securing support members extending from the card bracket base, and a toolless card securing subsystem on each of the card securing support members. Each toolless card securing subsystem may move towards a respective card aperture defined by the card while in a securing orientation, engage its respective card aperture and, in response, transition to a coupling orientation that allows that toolless card securing subsystem to move through its respective card aperture and, in response to extending through its respective card aperture and through the card, transition back to the securing orientation to secure the card to the card bracket base via engagement with the card.

Figure 8A:
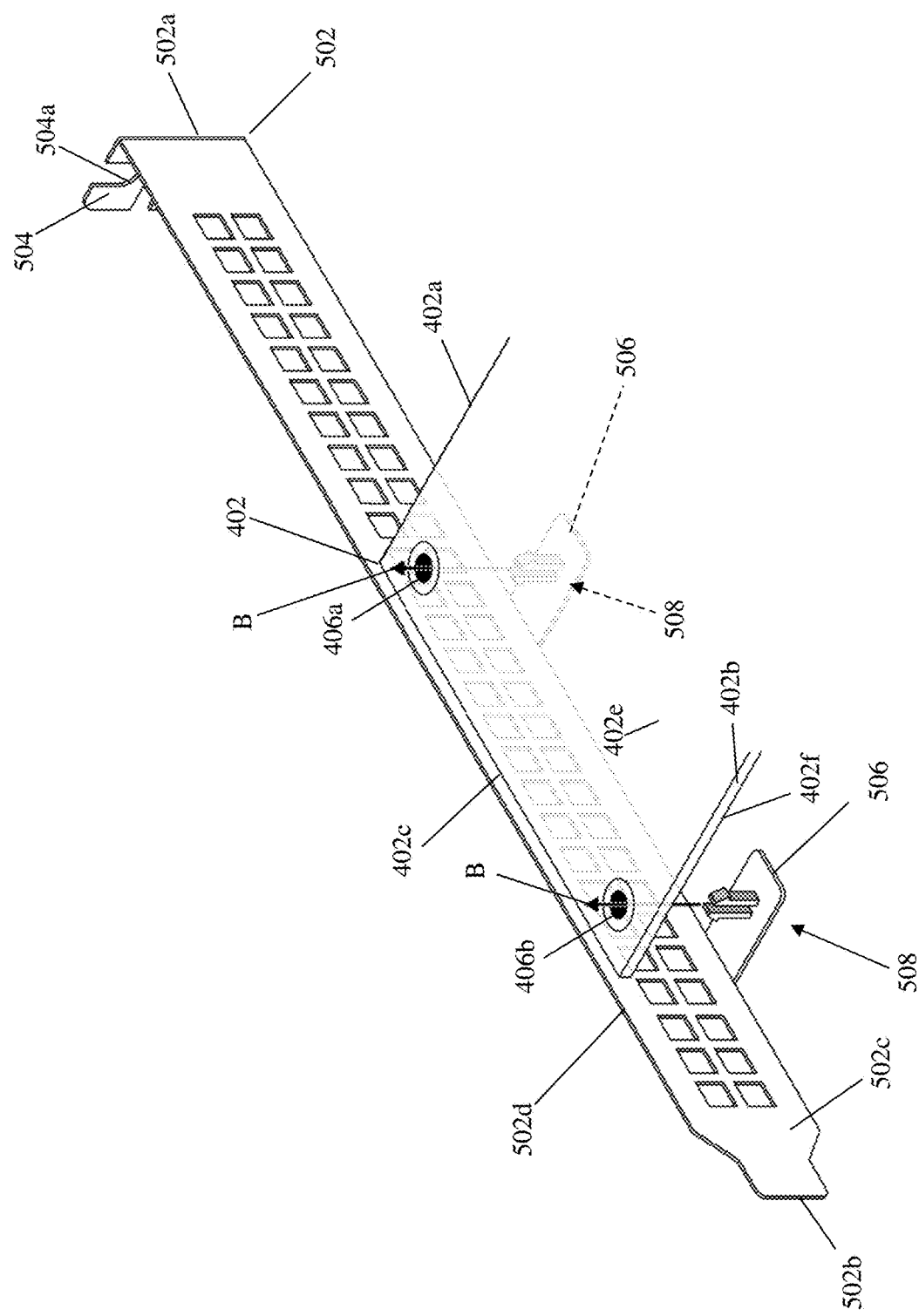
FIG. 8A is partially transparent perspective view illustrating an embodiment of the card of FIG. 4 being coupled to the full-height bracket of FIGS. 5A and 5B during the method of FIG. 7.

The method 700 begins at block 702 where toolless card securing subsystems on a card bracket are moved from a first side of a card and towards respective card apertures on the card while in a securing orientation. With reference to FIG. 8A, in an embodiment of block 702, the card 400 may be positioned adjacent the "full-height" card bracket 500 such that the front edge 402c of the base 402 of the card 400 is located adjacent the front surface 502c of the card bracket base 502, with the card apertures 406a and 406b defined by the base 402 aligned with the toolless card securing subsystems 508 on the card securing support members 506. Similarly, with reference to FIG. 10A, in an embodiment of block 702, the card 400 may be positioned adjacent the "half-height" card bracket 600 such that the front edge 402c of the base 402 of the card 400 is located adjacent the front surface 602c of the card bracket base 602, with the card apertures 406a and 406b defined by the base 402 aligned with the toolless card securing subsystems 608 on the card securing support members 606.

Figure 10A:
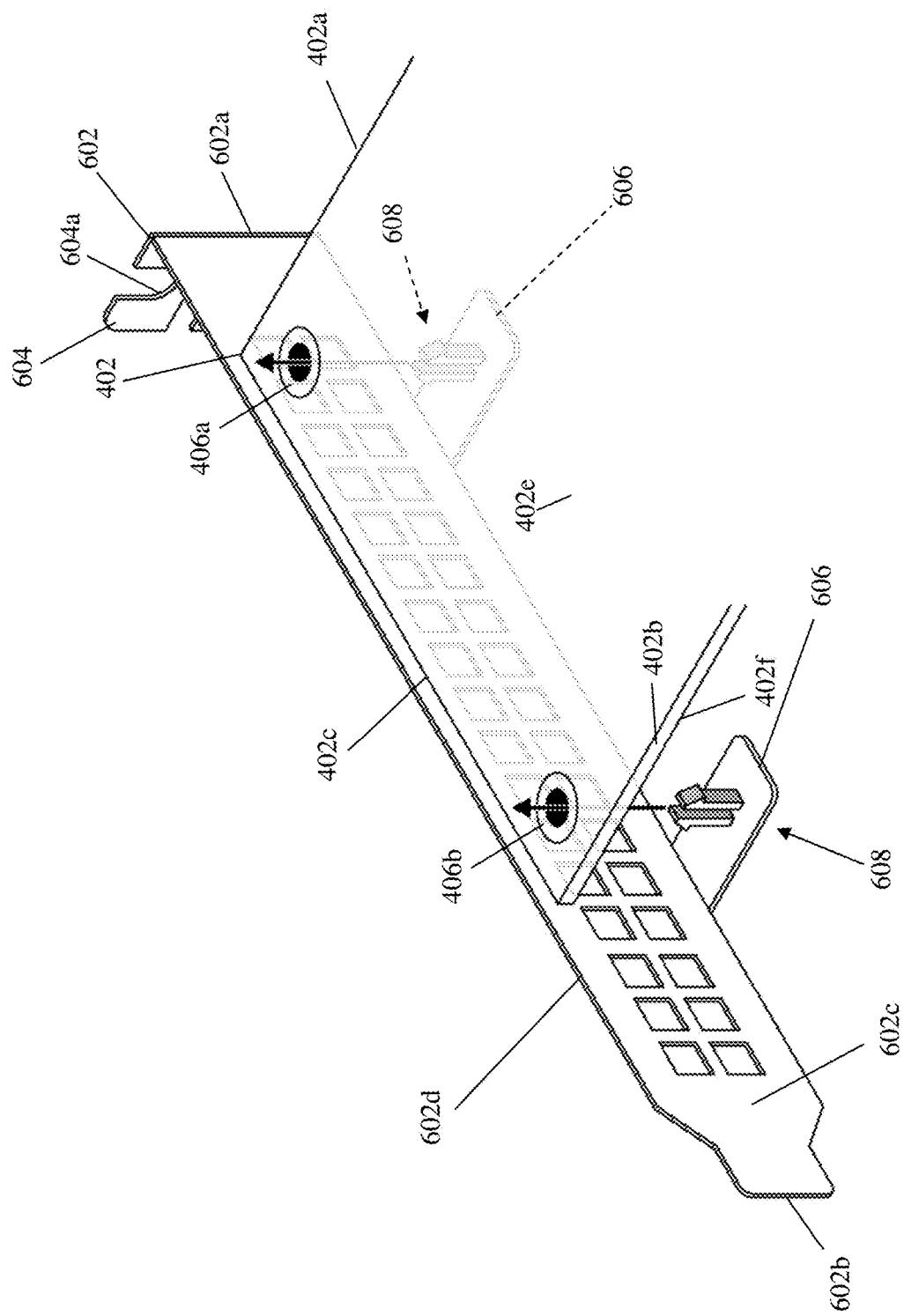
FIG. 10A is partially transparent perspective view illustrating an embodiment of the card of FIG. 4 being coupled to the half-height bracket of FIGS. 6A-6C during the method of FIG. 7.

FIG. 8B illustrates one of the toolless card securing subsystems 508 on one of the card securing support members 506 on the "full-height" card bracket 500, with the pair of toolless card securing members 510 and 512 on the toolless card securing subsystem 508 in a securing orientation A and aligned with the card aperture 406a/406b defined by the base 402 of the card 400, and one of skill in the art in possession of the present disclosure will appreciate how the toolless card securing subsystems 608 on the "half-height" card bracket 600 of FIG. 10A may operate in a similar manner. As illustrated, the toolless card securing subsystems 508 may then be moved in a direction B relative to the card apertures 406a/406b defined by the base 402 of the card 400, and one of skill in the art in possession of the present disclosure will appreciate how the toolless card securing subsystems 608 on the "half-height" card bracket 600 of FIG. 10A may operate in a similar manner.

The method 700 then proceeds to block 704 where the toolless card securing subsystems on the card bracket are engaged with the respective card apertures on the card while in the securing orientation. With reference to FIG. 8C, in an embodiment of block 704 and in response to the movement of the toolless card securing subsystems 508 in the direction B relative to the card apertures 406a/406b defined by the base 402 of the card 400 and into the card apertures 406a/406b defined by the base 402 of the card 400, the second portions 510b and 512b on each of the pair of toolless card securing members 510 and 512, respectively, may engage the base 402 of the card 400 adjacent the card apertures 406a/406b, and one of skill in the art in possession of the present disclosure will appreciate how the toolless card securing subsystems 608 on the "half-height" card bracket 600 of FIG. 10A may operate in a similar manner.

The method 700 then proceeds to block 706 where the toolless card securing subsystems on the card bracket transition from the securing orientation to a coupling orientation. In an embodiment of block 706 and in response to engagement of each of the pair of toolless card securing members 510 and 512 with the base 402 of the card 400 adjacent the card apertures 406a/406b and the continued movement of the toolless card securing subsystems 508 in the direction B through the card apertures 406a/406b defined by the base 402 of the card 400, the pair of toolless card securing members 510 and 512 on the toolless card securing subsystem 508 will transition into a coupling orientation that is provided as they move out of the securing orientation and towards each other, while also moving in the direction B through the card aperture apertures 406a/406b, as the diameter of the card apertures 406a/406b reduces. While not illustrated, one of skill in the art in possession of the present disclosure will appreciate how the toolless card securing subsystems 608 on the "half-height" card bracket 600 of FIG. 10A may operate in a similar manner. As such, one of skill in the art in possession of the present disclosure will appreciate how embodiments of the coupling orientation of the pair of toolless card securing members on the toolless card securing subsystem of the present disclosure may include a plurality of relative distances between the pair of toolless card securing members that are less than their relative distance when in the securing orientation, and may be provided as the diameter of the card apertures define by the card reduce while the toolless card securing subsystem is moved through those card apertures.

Figure 8D:
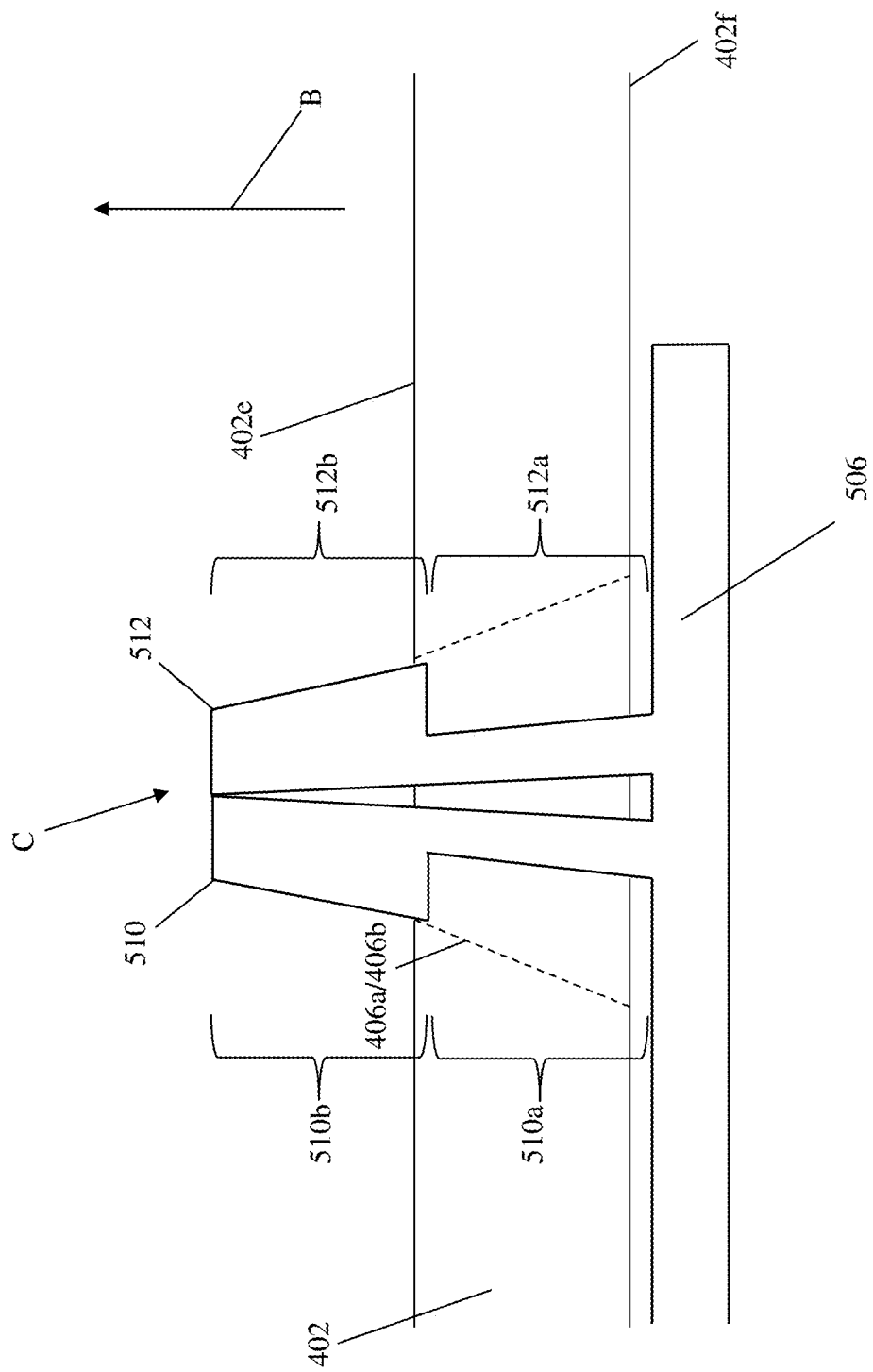
FIG. 8D is a side view illustrating an embodiment of the card of FIG. 4 being coupled to the full-height bracket of FIGS. 5A-5C during the method of FIG. 7.

The method 700 then proceeds to block 708 where the toolless card securing subsystems on the card bracket move through the respective card apertures on the card in the coupling orientation. With reference to FIG. 8D, an embodiment of block 708 is illustrated in which the pair of toolless card securing members 510 and 512 on the toolless card securing subsystem 508 are in a coupling orientation C that may be one of the coupling orientations discussed above, and that is provided immediately prior to the second portions 510b and 512b of the pair of toolless card securing members 510 and 512 extending through the card apertures 406a/406b defined by the base 402 of the card 400, and one of skill in the art in possession of the present disclosure will appreciate how the toolless card securing subsystems 608 on the "half-height" card bracket 600 of FIG. 10A may operate in a similar manner.

Figure 8E:
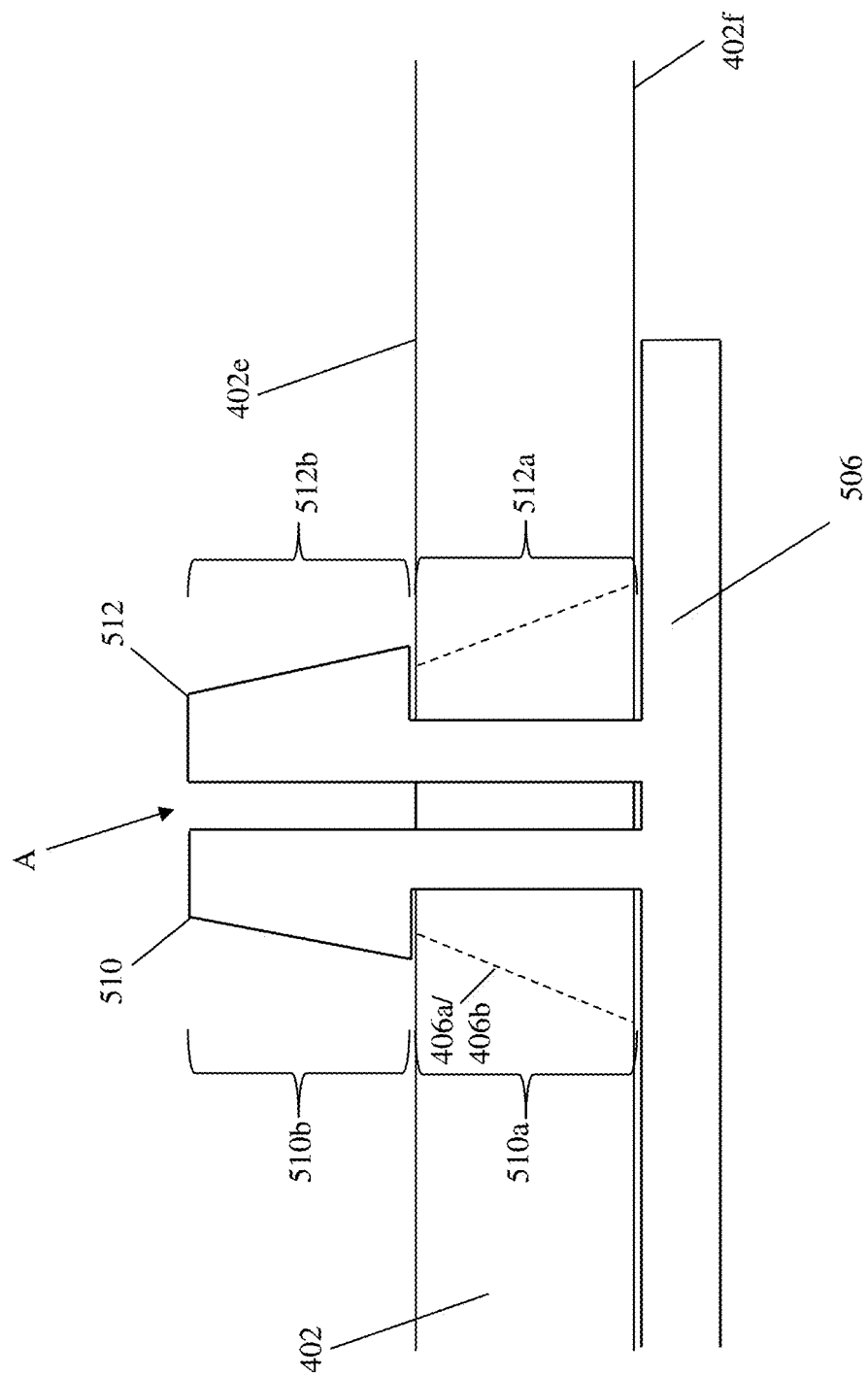
FIG. 8E is a side view illustrating an embodiment of the card of FIG. 4 coupled to the full-height bracket of FIGS. 5A-5C during the method of FIG. 7.

The method 700 then proceeds to block 710 where the toolless card securing subsystems on the card bracket extend through the respective card apertures on the card to a second side of the card and transition from the coupling orientation to the securing orientation. With reference to FIG. 8E, an embodiment of block 710 is illustrated in which the second portions 510b and 512b of the pair of toolless card securing members 510 and 512 on the toolless card securing subsystem 508 have extended through the card apertures 406a/406b defined by the base 402 of the card 400, allowing the pair of toolless card securing members 510 and 512 to transition back into the securing orientation A, and one of skill in the art in possession of the present disclosure will appreciate how the toolless card securing subsystems 608 on the "half-height" card bracket 600 of FIG. 10A may operate in a similar manner. As such, one of skill in the art in possession of the present disclosure will appreciate how the first portions 510a and 512a of the pair of toolless card securing members 510 and 512 may be resiliently biased to provide the securing orientation A, and may transition to the coupling orientations discussed above in response to forces resulting from being moved through the card apertures 406a/406b defined by the base 402 of the card 400, and one of skill in the art in possession of the present disclosure will appreciate how the toolless card securing subsystems 608 on the "half-height" card bracket 600 of FIG. 10A may operate in a similar manner.

The method 700 then proceeds to block 712 where the toolless card securing subsystems on the card bracket engage the second side of the card in the securing orientation to secure the card to the card bracket. With continued reference to FIG. 8E, one of skill in the art in possession of the present disclosure will recognize how, at block 712 and with the first portions 510a and 512a of the pair of toolless card securing members 510 and 512 located in the card apertures 406a/406b, the securing orientation A of the pair of toolless card securing members 510 and 512 provides for the engagement of the second portions 510b and 512b of the pair of toolless card securing members 510 and 512 with the side surface 402e on the base 402 of the card 400 in order to secure the card 400 to the card securing support members 506 and, thus, the "full-height" card bracket 500. While not illustrated in detail, one of skill in the art in possession of the present disclosure will appreciate how the toolless card securing subsystems 608 on the "half-height" card bracket 600 of FIG. 10A may operate in a similar manner.

Figure 8F:
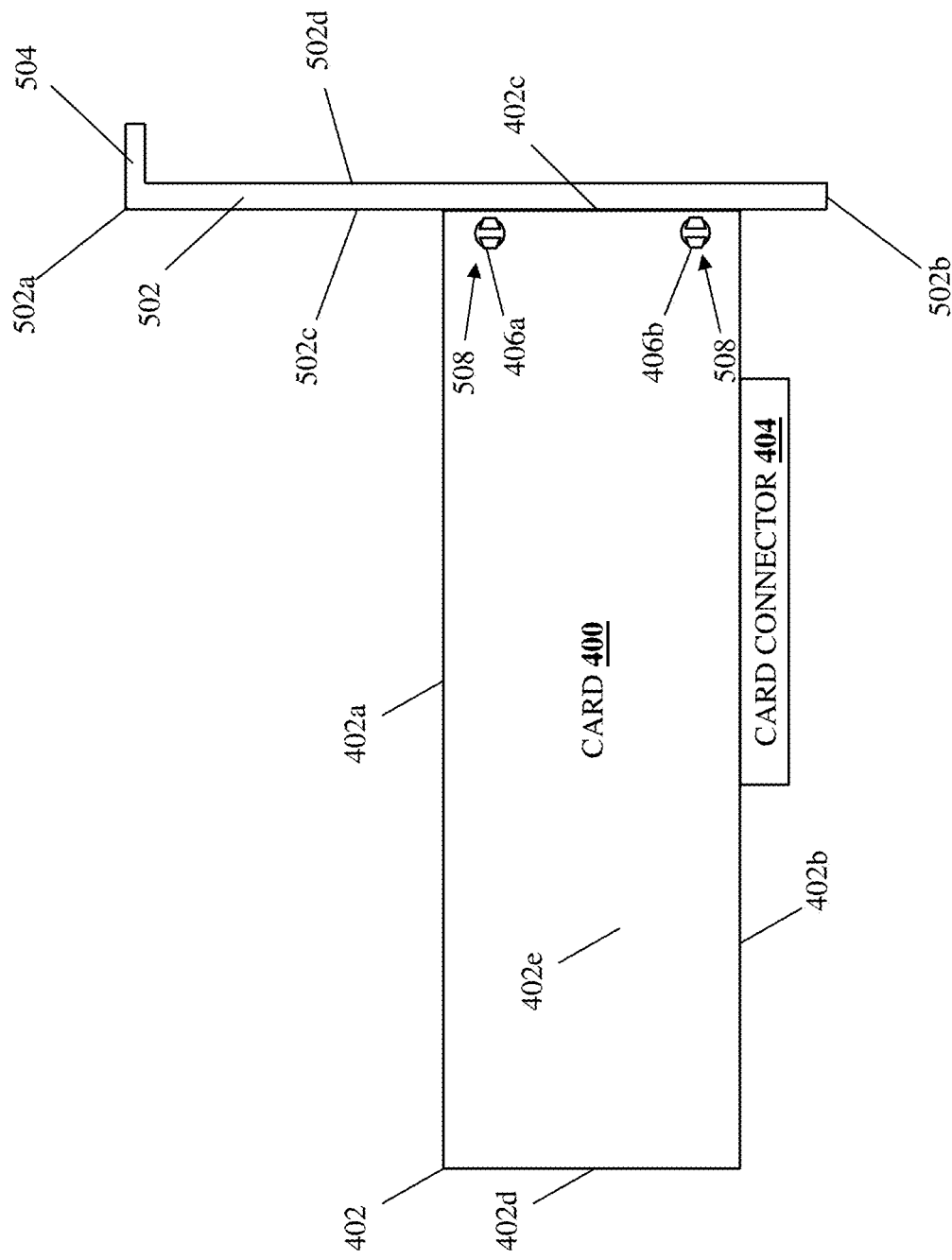
FIG. 8F is a side view illustrating an embodiment of the card of FIG. 4 coupled to the full-height bracket of FIGS. 5A-5C during the method of FIG. 7.
Figure 10B:
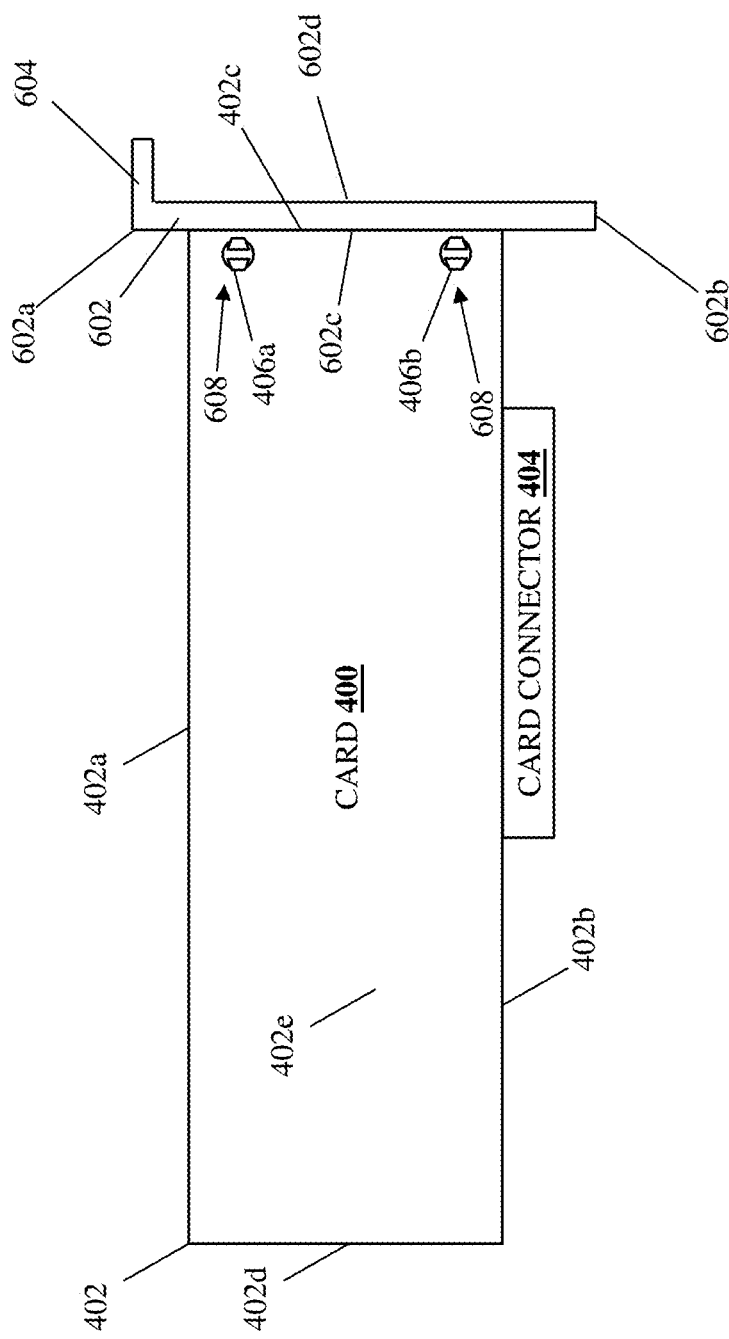
FIG. 10B is a side view illustrating an embodiment of the card of FIG. 4 coupled to the half-height bracket of FIGS. 6A-6C during the method of FIG. 7.
Figure 11:
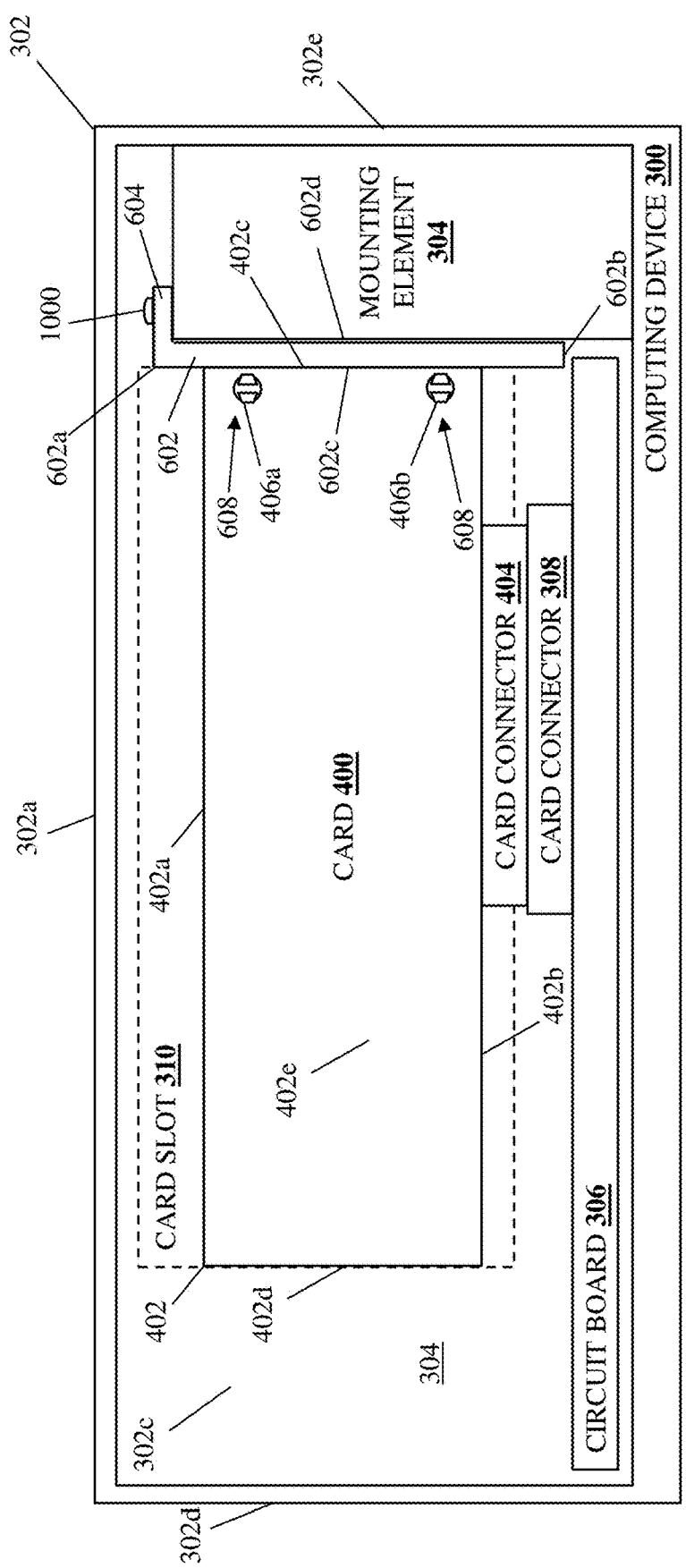
FIG. 11 is a schematic view illustrating an embodiment of the card and bracket of FIG. 10B positioned in the half-height card slot and coupled and mounted to the computing device of FIG. 3.

As illustrated in FIGS. 8F and 9, with the card 400 secured to the "full-height" card bracket 500, the card 400 may be positioned in the "full-height" card slot 210 in the chassis 202 of the computing device 200, the card connector 404 may be connected to the card connector 208 on the circuit board 206, and the "full-height" card bracket 500 may be mounted to the mounting element 204/chassis 202 via, for example, a mounting device 900 located in the chassis mounting channel 504a defined by the chassis mounting member 504 and engaging the mounting element 204. As illustrated in FIGS. 10B and 11, with the card 400 secured to the "half-height" card bracket 600, the card 400 may be positioned in the "half-height" card slot 310 in the chassis 302 of the computing device 300, the card connector 404 may be connected to the card connector 308 on the circuit board 306, and the "half-height" card bracket 600 may be mounted to the mounting element 304/chassis 302 via, for example, a mounting device 1000 located in the chassis mounting channel 604a defined by the chassis mounting member 604 and engaging the mounting element 304.

Referring now to FIG. 12, an embodiment of a method 1200 for toollessly decoupling a card from a bracket is illustrated. As discussed below, the systems and methods of the present disclosure provide for the decoupling of brackets from a card without the use of a tool, allowing the bracket used with a card to be quickly and easily switched when the card is moved between different chassis locations with different chassis mounting configurations. For example, the toolless card/bracket decoupling system of the present disclosure may include a card bracket base that mounts to a chassis with a chassis mounting configuration, spaced-apart card securing support members extending from the card bracket base, and a toolless card securing subsystem on each of the card securing support members. Each toolless card securing subsystem may extend from a first side of a card and through a respective card aperture defined by the card, and may engage a second side of the card that is opposite the card from the first side of the card in a securing orientation that secures the card to the card bracket base. Each toolless card securing subsystem may, while the card is secured to the first card bracket base and in response to a force that is provided without the use of a tool, transition from the securing orientation to the coupling orientation and, while in the coupling orientation, move from the second side of the card and through its respective card aperture defined by the card in order to unsecure the card from the first card bracket base.

Figure 13A:
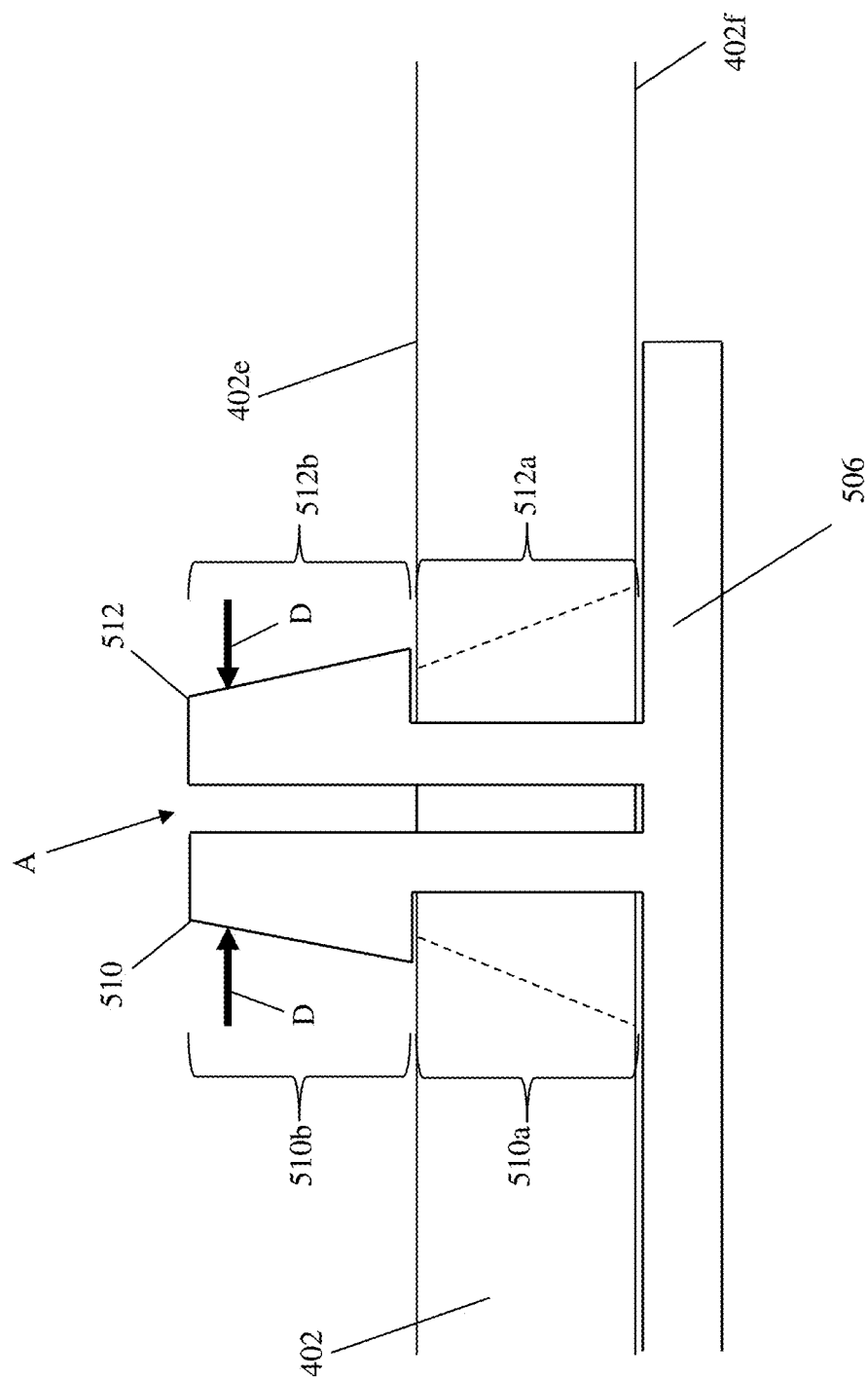
FIG. 13A is a side view illustrating an embodiment of the card of FIG. 4 being decoupled from the full-height bracket of FIGS. 5A-5C during the method of FIG. 12.

The method 1200 begins at block 1202 where toolless card securing subsystems on a card bracket are transitioned from a securing orientation to a coupling orientation in response to a force that is provided without the use of a tool. With reference to FIGS. 8F and 13A, the first portions 510a and 512a of the pair of toolless card securing members 510 and 512b are located in the card apertures 406a/406b, with the pair of toolless card securing members 510 and 512b in the securing orientation A such that the second portions 510b and 512b of the pair of toolless card securing members 510 and 512 engage the side surface 402e on the base 402 of the card 400 in order to secure the card 400 to the card securing support members 506 and, thus, the "full-height" card bracket 500. While not illustrated in detail, one of skill in the art in possession of the present disclosure will appreciate how the toolless card securing subsystems 608 on the "half-height" card bracket 600 of FIG. 10A may operate in a similar manner.

Figure 13B:
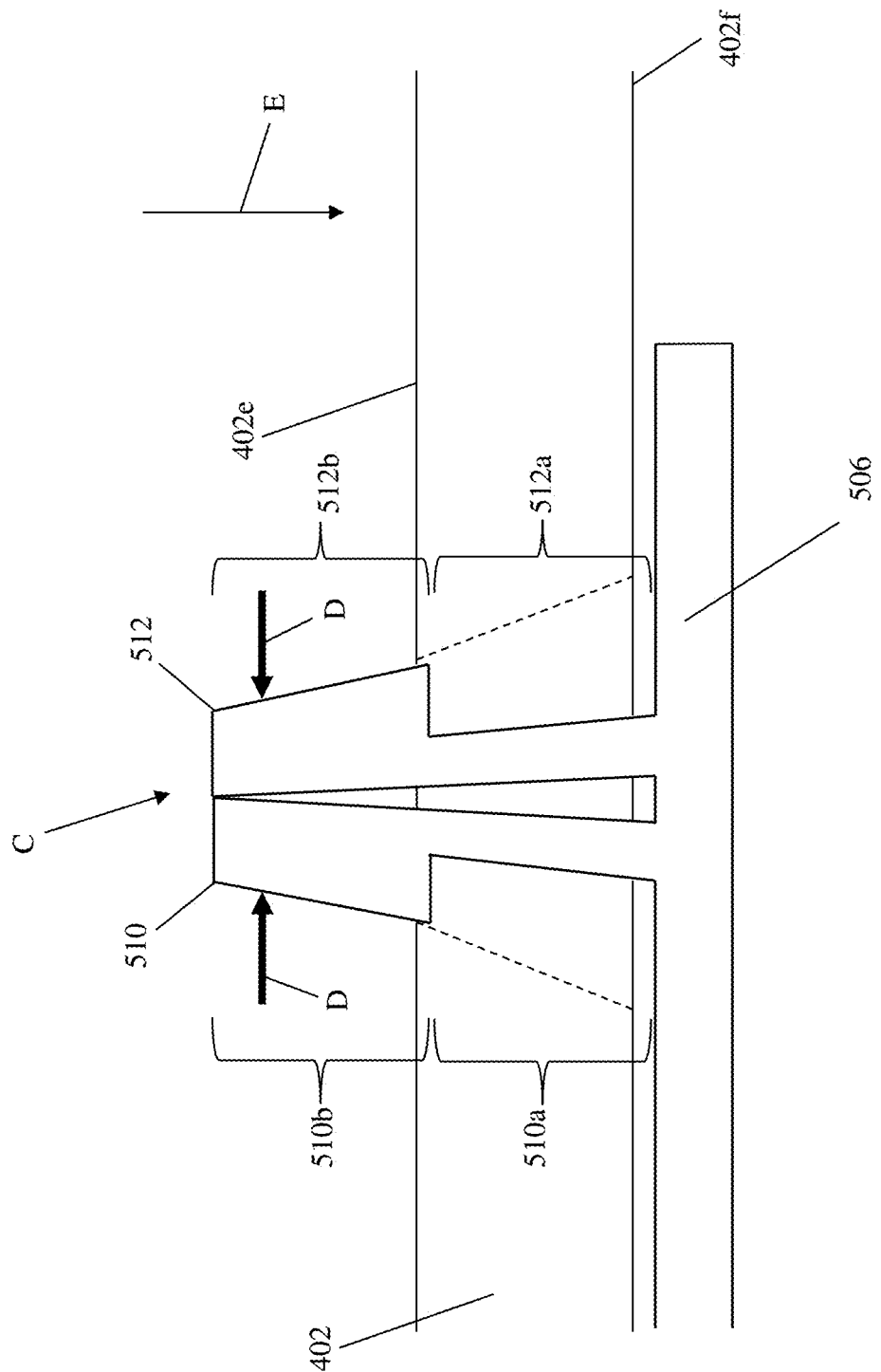
FIG. 13B is a side view illustrating an embodiment of the card of FIG. 4 being decoupled from the full-height bracket of FIGS. 5A-5C during the method of FIG. 12.

In an embodiment of block 1202, a force D may be provided on each of the second portions 510b and 512b of the pair of toolless card securing members 510 and 512 without the use of a tool (e.g., a user may use their fingers to "pinch" the second portions 510b and 512b of the pair of toolless card securing members 510 and 512 in order to provide the force D), and one of skill in the art in possession of the present disclosure will appreciate how the toolless card securing subsystems 608 on the "half-height" card bracket 600 of FIG. 10A may operate in a similar manner. As illustrated in FIG. 13B, the force D will cause the pair of toolless card securing members 510 and 512 to move towards each other and transition to the coupling orientation C that provides pair of toolless card securing members 510 and 512 at a relative distance from each other that is less than their distance from each other when in the securing orientation A, and that coupling orientation C allows the second portions 510b and 512b of the pair of toolless card securing members 510 and 512 to move into the card apertures 406a/406b defined by the base 402 of the card 400. While not illustrated in detail, one of skill in the art in possession of the present disclosure will appreciate how the toolless card securing subsystems 608 on the "half-height" card bracket 600 of FIG. 10A may operate in a similar manner.

Figure 13C:
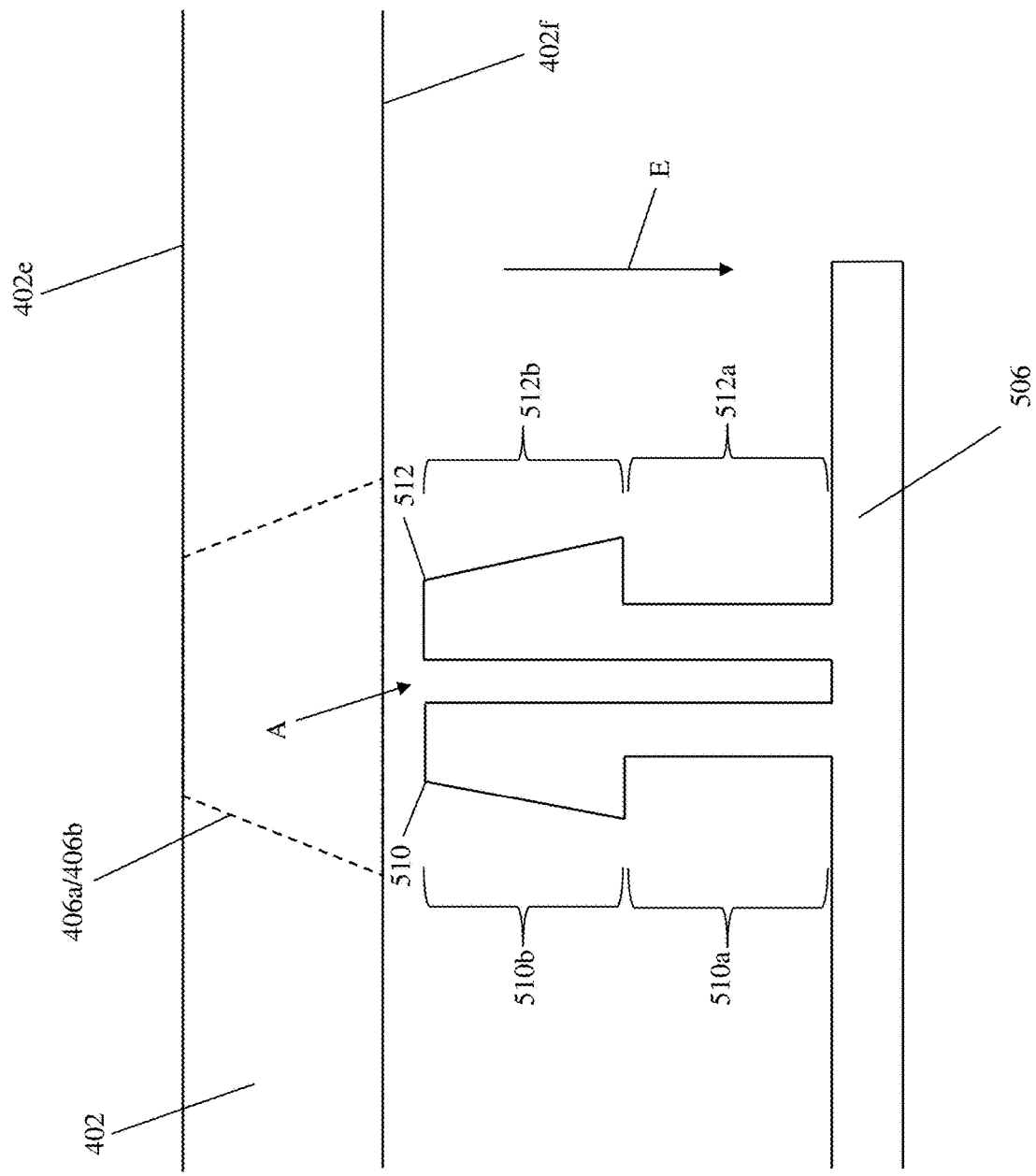
FIG. 13C is a side view illustrating an embodiment of the card of FIG. 4 decoupled from the full-height bracket of FIGS. 5A-5C during the method of FIG. 12.

The method 1200 then proceeds to block 1204 where the toolless card securing subsystems on the card bracket move from the second side of the card and through respective card apertures on the card while in a coupling orientation to unsecure the card from the card bracket. With reference to FIGS. 13B and 13C, in an embodiment of block 1204, the pair of toolless card securing members 510 and 512b in the coupling orientation C may be moved in a direction E relative to the card apertures 406a/406b defined by the base 402 of the card 400 until the pair of toolless card securing members 510 and 512b exit the card apertures 406a/406b defined by the base 402 of the card 400 such that the card is unsecured from the "full-height" card bracket 500, and one of skill in the art in possession of the present disclosure will appreciate how the toolless card securing subsystems 608 on the "half-height" card bracket 600 of FIG. 10A may operate in a similar manner.

Figure 14:
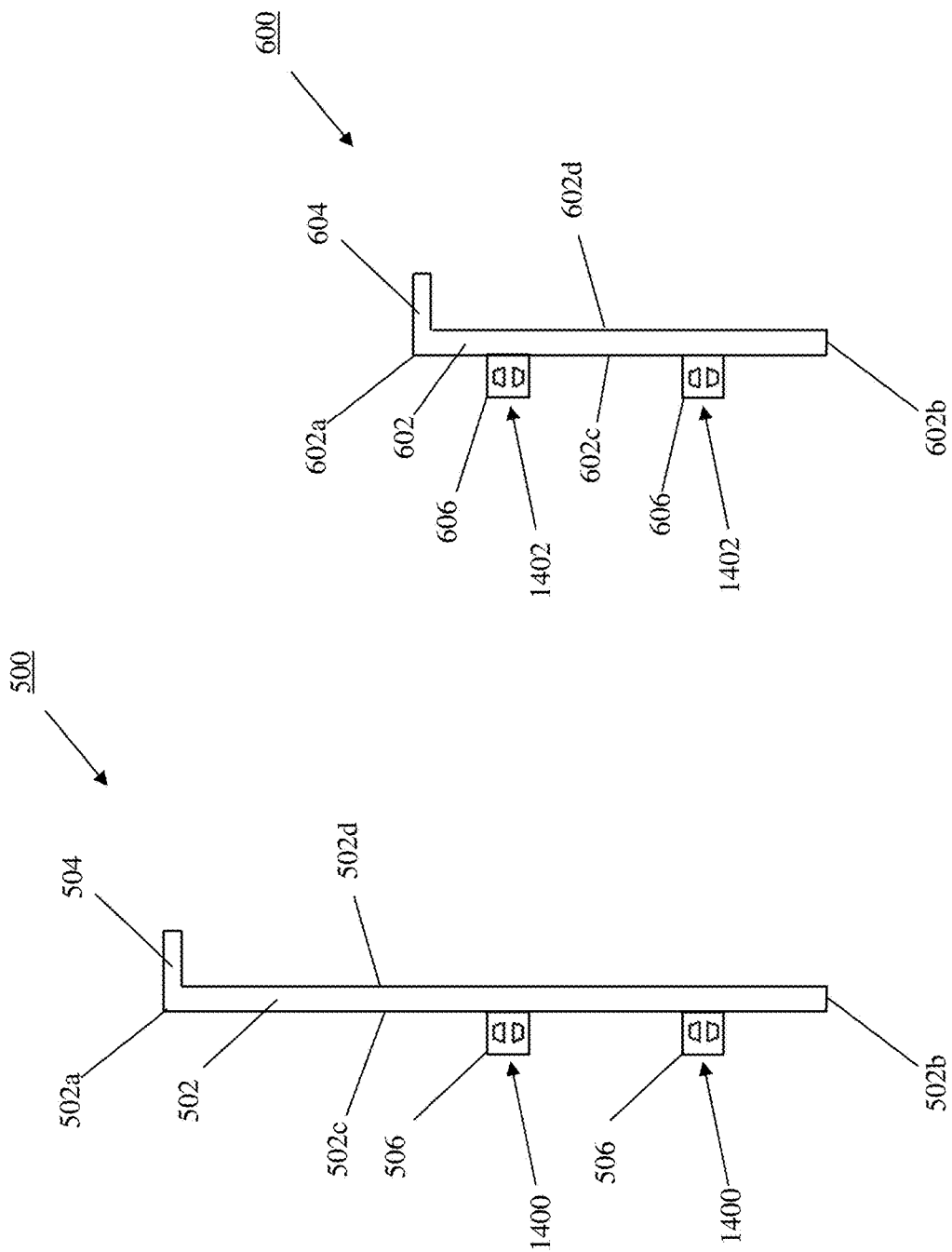
FIG. 14 illustrates embodiments of the full-height bracket of FIGS. 5A-5C and the half-height bracket of FIGS. 6A-6C with modified toolless card securing subsystems.

With reference to FIG. 14, embodiments of the full-height bracket 500 of FIGS. 5A-5C and the half-height bracket 600 of FIGS. 6A-6C are illustrated with modified toolless card securing subsystems 1400 and 1402, respectively. As can be seen by a comparison of FIGS. 5A and 6A and FIG. 14, the modified toolless card securing subsystems 1400 and 1402 are rotated by 90 degrees, which one of skill in the art in possession of the present disclosure will appreciate may allow a user to more easily actuate the modified toolless card securing subsystems 1400 and 1402 with their fingers (i.e., in order to release the card 400 from the full-height bracket 500 or the half-height bracket 600) without obstruction from the front surfaces 502c and 602c on the card bracket bases 502 and 602.

Thus, systems and methods have been described that provide for the decoupling of brackets from a PCIe card without the use of a tool, allowing the bracket used with a PCIe card to be quickly and easily switched when the PCIe card is moved between "full-height" PCIe card slots and "half-height" PCIe card slots. For example, the toolless PCIe card/bracket decoupling system of the present disclosure may include a PCIe card bracket base that mounts to a chassis with a chassis mounting configuration, spaced-apart PCIe card securing support members extending from the PCIe card bracket base, and a toolless PCIe card securing subsystem on each of the PCIe card securing support members. Each toolless PCIe card securing subsystem may extend from a first side of a PCIe card and through a respective PCIe card aperture defined by the PCIe card, and may engage a second side of the PCIe card that is opposite the PCIe card from the first side of the PCIe card in a securing orientation that secures the PCIe card to the PCIe card bracket base. Each toolless PCIe card securing subsystem may, while the PCIe card is secured to the first PCIe card bracket base and in response to a force that is provided without the use of a tool, transition from the securing orientation to the coupling orientation and, while in the coupling orientation, move from the second side of the PCIe card and through its respective PCIe card aperture defined by the PCIe card in order to unsecure the PCIe card from the first PCIe card bracket base. As such, one of skill in the art in possession of the present disclosure will recognize how the methods 700 and 1200 described above allow a PCIe card to be quickly and easily be moved between a "full-height" PCIe card slot and a "half-height" PCIe card slot in the same or different computing device chassis without the use of a tool.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A toolless card/bracket coupling system, comprising:
   a card;
   a first card bracket base that includes a full-height chassis card slot mounting configuration and that is configured to mount to a full-height chassis card slot mounting element provided in a full-height chassis card slot included in a chassis;
   a plurality of first card securing support members that extend from the first card bracket base in a spaced-apart orientation;
   a second card bracket base that includes a half-height chassis card slot mounting configuration and that is configured to mount to a half-height chassis card slot mounting element provided in a half-height chassis card slot included in a chassis;
   a plurality of second card securing support members that extend from the second card bracket base in the spaced apart orientation such that the spacing of the plurality of second card securing support members is the same as the spacing of the plurality of first card securing support members;
   a toolless card securing subsystem that is included on each of the plurality of first card securing support members and each of the plurality of second card securing support members, wherein each toolless card securing subsystem includes:
      a pair of spaced-apart toolless card securing members that each include a first portion that extends separately from the first card securing support member or the second card securing support member, and that each include a second portion that extends from the first portion with a greater width than the first portion immediately adjacent the first portion while reducing in width away from the first portion, wherein each pair of spaced-apart toolless card securing members is configured to:
         move, from the first side of the card while in a securing orientation in which the second portions on that pair of spaced-apart toolless card securing members are spaced apart by a first distance, towards a respective card aperture that is defined by the card and that reduces in diameter between the first side of the card and a second side of the card that is opposite the card from the first side;
         engage the second portions on that pair of spaced-apart toolless card securing members with their respective card aperture defined by the card;
         transition, in response to engaging and moving the second portions on that pair of spaced-apart toolless card securing members into their respective card aperture defined by the card, from the securing orientation to a coupling orientation in which the spacing between the second portions on that pair of spaced-apart toolless card securing members is reduced in order to allow that pair of spaced-apart toolless card securing members to move through their respective card aperture defined by the card; and
         transition, in response to the second portions on that pair of spaced-apart toolless card securing members extending through their respective card aperture defined by the card and past the second side of the card, from the coupling orientation to the securing orientation that secures the card to the first card bracket base or the second card bracket base via engagement of the second portions on that pair of spaced-apart toolless card securing members with the second side of the card.

2. The system of claim 1, wherein the full-height chassis card slot is a full-height Peripheral Component Interconnect express (PCIe) card slot, and wherein the half-height chassis card slot is a half-height PCIe card slot.

3. The system of claim 1, wherein each pair of spaced-apart toolless card securing members includes a first toolless card securing member that is parallel to a second toolless card securing member.

4. The system of claim 1, wherein the second portions on each pair of spaced-apart toolless card securing members reduce in width away from the first portions on that pair of spaced-apart toolless card securing members such that those second portions are inclined towards a space between that pair of spaced-apart toolless card securing members.

5. The system of claim 1, wherein the card is a Peripheral Component Interconnect express (PCIe) card.

6. The system of claim 1, wherein the plurality of first card securing support members include a pair of first card securing support members, and wherein the plurality of second card securing support members include a pair of second card securing support members.

7. The system of claim 1, wherein each toolless card securing subsystem that is included on each of the plurality of first card securing support members is configured to:
   transition, while the card is secured to the first card bracket base and in response to a force that is provided without the use of a tool, from the securing orientation to the coupling orientation; and
   move, while in the coupling orientation, from the second side of the card and through its respective card aperture defined by the card in order to unsecure the card from the first card bracket base.

8. An Information Handling System (IHS), comprising:
   a first chassis;
   a full-height card slot that is defined by the first chassis and that includes a full-height card slot mounting element;
   a first card connector that is located adjacent the full-height card slot in the first chassis;
   a second chassis;
   a half-height card slot that is defined by the second chassis and that includes a half-height card slot mounting element;
   a second card connector that is located adjacent the half-height card slot in the second chassis;
   a first half-height card that is connected to the first card connector;
   a second half-height card that includes the same form-factor as the first half-height card and that is connected to the second card connector;
   a first card bracket base that is mounted to the first chassis and that includes a full-height card slot mounting configuration;
   a plurality of first card securing support members that extend from the first card bracket base in a spaced-apart orientation;
   a toolless card securing subsystem that is included on each of the plurality of first card securing support members, wherein each toolless card securing subsystem on each of the plurality of first card securing support members includes:
      a pair of spaced-apart toolless card securing members that each include a first portion that extends separately from the first card securing support member, and that each include a second portion that extends from the first portion with a greater width than the first portion immediately adjacent the first portion while reducing in width away from the first portion,
wherein the first portion of each pair of spaced-apart toolless card securing members on each toolless card securing subsystem that is included on each of the plurality of first card securing support members extends from a first side of the first half-height card and through a respective first card aperture that is defined by the first half-height card and that reduces in diameter between the first side of the first half-height card and a second side of the first half-height card that is opposite the first half-height card from the first side, and wherein the second portion of each pair of spaced-apart toolless card securing members on each toolless card securing subsystem that is included on each of the plurality of first card securing support members are spaced apart by a first distance and engage a second side of the first half-height card that is opposite the first half-height card from the first side of the first half-height card in a securing orientation that secures the first half-height card to the first card bracket base, and wherein each toolless card securing subsystem that is included on each of the plurality of first card securing support members is configured to:
transition, while the first half-height card is secured to the first card bracket base and in response to a force that is provided without the use of a tool, from the securing orientation to a coupling orientation in which the spacing between the second portions on that pair of spaced-apart toolless card securing members is reduced in order to allow that toolless card securing subsystem to move through its respective first card aperture defined by the first half-height card; and
move, while in the coupling orientation, from the second side of the first half-height card and through its respective first card aperture defined by the first half-height card in order to unsecure the first half-height card from the first card bracket base;
a second first card bracket base that is mounted to the second chassis and that includes a half-height card slot mounting configuration;
a plurality of second card securing support members that extend from the second card bracket base in the spaced-apart orientation such that the spacing of the plurality of second card securing support members is the same as the spacing of the plurality of first card securing support members; and
the toolless card securing subsystem that is included on each of the plurality of second card securing support members, wherein each toolless card securing subsystem included on each of the plurality of second card securing support members includes:
a pair of spaced-apart toolless card securing members that each include a first portion that extends separately from the second card securing support member, and that each include a second portion that extends from the first portion with a greater width than the first portion immediately adjacent the first portion while reducing in width away from the first portion,
wherein the first portion of each pair of spaced-apart toolless card securing members on each toolless card securing subsystem that is included on each of the plurality of second card securing support members extends from a first side of the second half-height card and through a respective second card aperture that is defined by the second half-height card and that reduces in diameter between the first side of the second half-height card and a second side of the second half-height card that is opposite the second half-height card from the first side, and engages a second side of the second half-height card that is opposite the second half-height card from the first side of the second half-height card in the securing orientation that secures the second half-height card to the second card bracket base, and wherein each toolless card securing subsystem that is included on each of the plurality of second card securing support members is configured to:
transition, while the second half-height card is secured to the second card bracket base and in response to a force that is provided without the use of a tool, from the securing orientation to a coupling orientation in which the spacing between the second portions on that pair of spaced-apart toolless card securing members is reduced in order to allow that toolless card securing subsystem to move through its respective second card aperture defined by the second half-height card; and
move, while in the coupling orientation, from the second side of the second half-height card and through its respective second card aperture defined by the second half-height card in order to unsecure the second half-height card from the second card bracket base.

9. The IHS of claim 8, wherein the first full-height chassis card slot is a full-height Peripheral Component Interconnect express (PCIe) card slot, and wherein the half-height chassis card slot is a half-height PCIe card slot.

10. The IHS of claim 8, wherein each pair of spaced-apart toolless card securing members includes a first toolless card securing member that is parallel to a second toolless card securing member.

11. The IHS of claim 8, wherein the second portions on each pair of spaced-apart toolless card securing members reduce in width away from the first portions on that pair of spaced-apart toolless card securing members such that those second portions are inclined towards a space between that pair of spaced-apart toolless card securing member.

12. The IHS of claim 8, wherein the first card and the second card are Peripheral Component Interconnect express (PCIe) cards.

13. The IHS of claim 8, wherein the plurality of first card securing support members include a pair of first card securing support members, and wherein the plurality of second card securing support members include a pair of second card securing support members.

14. A method for toollessly coupling a card to a bracket, comprising:
positioning, by a first card bracket base that includes a full-height chassis card slot mounting configuration and that is configured to mount to a full-height chassis card slot mounting element provided in a full-height chassis card slot included in a chassis, adjacent a first side of a first half-height card;
moving, from the first side of the first half-height card by each pair of spaced-apart toolless card securing members that are included on respective first card securing support members on the first card bracket base and that each include a first portion that extends separately in a spaced-apart orientation from its first card securing support member and that each include a second portion that extends from the first portion with a greater width than the first portion immediately adjacent the first portion while reducing in width away from the first portion, in a securing orientation in which the second portions on that pair of spaced-apart toolless card securing members are spaced part by a first distance and towards a respective card aperture that is defined by the first half-height card and that reduces in diameter between the first side of the first half-height card and a second side of the first half-height card that is opposite the first half-height card from the first side;

engaging, by each pair of spaced-apart toolless card securing members on the respective first card securing support members, its respective card aperture defined by the first half-height card;

transitioning, by each pair of spaced-apart toolless card securing members on the respective first card securing support members in response to engaging and moving into its respective card aperture defined by the first half-height card, from the securing orientation to a coupling orientation in which the spacing between the second portions on that pair of spaced-apart toolless card securing members is reduced in order to allow that pair of spaced apart toolless card securing members to move through their respective card aperture defined by the first half-height card;

transitioning, by each pair of spaced-apart toolless card securing members on the respective first card securing support members in response to extending through its respective card aperture defined by the first half-height card and past a second side of the first half-height card that is opposite the first half-height card from the first side of the first half-height card, from the coupling orientation to the securing orientation that secures the first half-height card to the first card bracket base via engagement of the second portion on each pair of spaced-apart toolless card securing members on the respective first card securing support members with the second side of the first half-height card;

positioning, by a second card bracket base that includes a half-height chassis card slot mounting configuration and that is configured to mount to a half-height chassis card slot mounting element provided in a half-height chassis card slot included in a chassis, adjacent a first side of a second half-height card;

moving, from the first side of the second half-height card that is identical to the first half-height card by each pair of spaced-apart toolless card securing members that are included on respective second card securing support members on the second card bracket base and that each include a first portion that extends separately in the spaced-apart orientation from its second card coupling support member and that each include a second portion that extends from the first portion with a greater width than the first portion immediately adjacent the first portion while reducing in width away from the first portion, in a securing orientation in which the second portions on that pair of spaced-apart toolless card securing members are spaced apart by a first distance and towards a respective card aperture that is defined by the second half-height card and that reduces in diameter between the first side of the second half-height card and a second side of the second half-height card that is opposite the second half-height card from the first side, wherein the spacing of the plurality of second card securing support members is the same as the spacing of the plurality of first card securing support members;

engaging, by each pair of spaced-apart toolless card securing members on the respective second card securing support members, its respective card aperture defined by the second half-height card;

transitioning, by each pair of spaced-apart toolless card securing members on the respective second card securing support members in response to engaging and moving into its respective card aperture defined by the second half-height card, from the securing orientation to a coupling orientation in which the spacing between the second portions on that pair of spaced-apart toolless card securing members is reduced in order to allow that pair of spaced apart toolless card securing members to move through their respective card aperture defined by the second half-height card; and transitioning, by each pair of spaced-apart toolless card securing members on the respective second card securing support members in response to extending through its respective card aperture defined by the second half-height card and past a second side of the second half-height card that is opposite the second half-height card from the first side of the second half-height card, from the coupling orientation to the securing orientation that secures that pair of spaced-apart toolless card securing members to the second card bracket base via engagement of the second portion on each pair of spaced-apart toolless card securing members on the respective second card securing support members with the second side of the second half-height card.

15. The method of claim 14, wherein the full-height chassis card slot is a full-height Peripheral Component Interconnect express (PCIe) card slot, and wherein the half-height chassis card slot is a half-height PCIe card slot.

16. The method of claim 14, wherein each pair of spaced-apart toolless card securing members includes a first toolless card securing member that is parallel to a second toolless card securing member.

17. The method of claim 14, wherein the second portions on each pair of spaced-apart toolless card securing members reduce in width away from the first portions on that pair of spaced-apart toolless card securing members such that those second portions are inclined towards a space between that pair of spaced-apart toolless card securing members.

18. The method of claim 14, wherein the first card and the second card are Peripheral Component Interconnect express (PCIe) cards.

19. The method of claim 14, wherein the plurality of first card securing support members include a pair of first card securing support members, and wherein the plurality of second card securing support members include a pair of second card securing support members.

20. The method of claim 14, further comprising:
transitioning, by each pair of spaced-apart toolless card securing members on the respective first card securing support members while the first half-height card is secured to the first card bracket base and in response to a force that is provided without the use of a tool, from the securing orientation to the coupling orientation that allows that pair of spaced-apart toolless card securing members to move through its respective first card aperture defined by the first half-height card; and moving, by each pair of spaced-apart toolless card securing members on the respective first card securing support members while in the coupling orientation, from the second side of the first half-height card and through its respective first card aperture defined by the first half-height card in order to unsecure the first half-height card from the first card bracket base.

* * * * *